(12) United States Patent
Girt et al.

(10) Patent No.: US 8,981,211 B2
(45) Date of Patent: Mar. 17, 2015

(54) INTERLAYER DESIGN FOR EPITAXIAL GROWTH OF SEMICONDUCTOR LAYERS

(75) Inventors: Erol Girt, San Jose, CA (US); Mariana Rodica Munteanu, Santa Clara, CA (US)

(73) Assignee: Zetta Research and Development LLC—AQT Series, Wilmington, DE (US)

( * ) Notice: Subject to any disclaimer, the term of this patent is extended or adjusted under 35 U.S.C. 154(b) by 1457 days.

(21) Appl. No.: 12/405,963

(22) Filed: Mar. 17, 2009

(65) Prior Publication Data
US 2009/0235983 A1 Sep. 24, 2009

Related U.S. Application Data

(60) Provisional application No. 61/037,571, filed on Mar. 18, 2008.

(51) Int. Cl.
| | |
|---|---|
| *H01L 31/00* | (2006.01) |
| *H01L 21/02* | (2006.01) |
| *H01L 31/0368* | (2006.01) |
| *H01L 31/0392* | (2006.01) |
| *H01L 31/068* | (2012.01) |
| *H01L 31/18* | (2006.01) |

(52) U.S. Cl.
CPC .... *H01L 21/02521* (2013.01); *H01L 21/02488* (2013.01); *H01L 21/02491* (2013.01); *H01L 21/02505* (2013.01); *H01L 21/02513* (2013.01); *H01L 21/02516* (2013.01); *H01L 31/03682* (2013.01); *H01L 31/0392* (2013.01); *H01L 31/068* (2013.01); *H01L 31/1872* (2013.01); *Y02E 10/546* (2013.01); *Y02E 10/547* (2013.01)
USPC ........... 136/258; 136/256; 438/660; 438/694; 257/77; 257/E21.061; 257/E29.104

(58) Field of Classification Search
CPC ............... H01L 21/02488; H01L 21/02491; H01L 21/02505; H01L 21/02513; H01L 21/02516; H01L 31/03682; H01L 31/0392; H01L 31/068; H01L 31/1872
USPC ............... 136/258, 256; 257/77, E21.061, 257/E29.104; 438/660, 694
See application file for complete search history.

(56) References Cited

U.S. PATENT DOCUMENTS

| | | | | |
|---|---|---|---|---|
| 8,148,631 | B2 * | 4/2012 | Fix et al. | 136/262 |
| 2005/0087225 | A1 * | 4/2005 | Morooka et al. | 136/256 |
| 2005/0139252 | A1 * | 6/2005 | Shim | 136/244 |
| 2007/0044832 | A1 * | 3/2007 | Fritzemeier | 136/252 |
| 2007/0159065 | A1 * | 7/2007 | Yan et al. | 313/503 |
| 2007/0224453 | A1 * | 9/2007 | Inamura et al. | 428/827 |
| 2008/0078444 | A1 * | 4/2008 | Atanackovic | 136/256 |
| 2008/0105299 | A1 * | 5/2008 | Krasnov | 136/256 |
| 2008/0216891 | A1 * | 9/2008 | Harkness et al. | 136/256 |

* cited by examiner

*Primary Examiner* — Matthew Martin
(74) *Attorney, Agent, or Firm* — Mattingly & Malur, PC

(57) ABSTRACT

An interlayer structure that, in one implementation, includes a combination of an amorphous or nano-crystalline seed-layer, and one or more metallic layers, deposited on the seed layer, with the fcc, hcp or bcc crystal structure is used to epitaxially orient a semiconductor layer on top of non-single-crystal substrates. In some implementations, this interlayer structure is used to establish epitaxial growth of multiple semiconductor layers, combinations of semiconductor and oxide layers, combinations of semiconductor and metal layers and combination of semiconductor, oxide and metal layers. This interlayer structure can also be used for epitaxial growth of p-type and n-type semiconductors in photovoltaic cells.

34 Claims, 18 Drawing Sheets

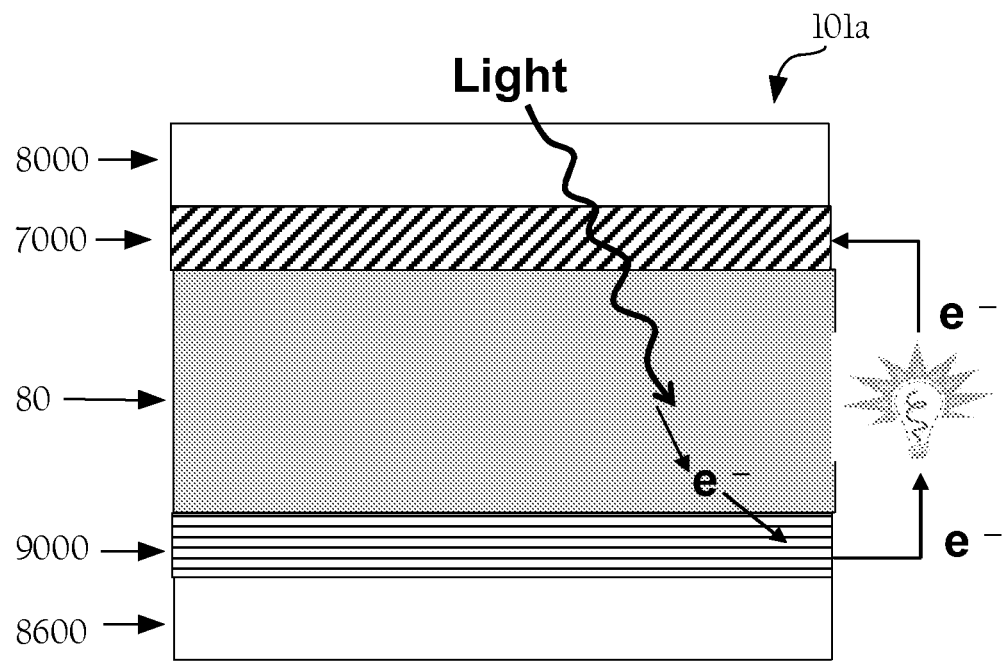
Fig._16a
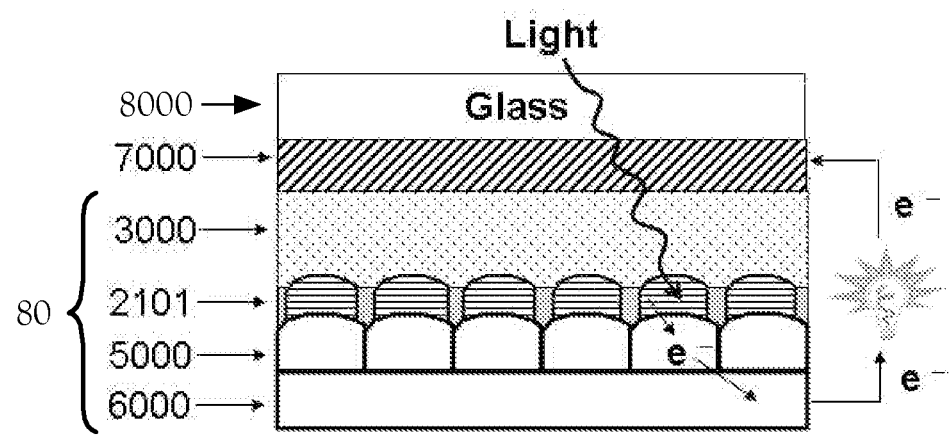
Fig._16b

INTERLAYER DESIGN FOR EPITAXIAL GROWTH OF SEMICONDUCTOR LAYERS

CROSS-REFERENCE TO RELATED APPLICATIONS

The present application claims priority to U.S. Provisional Application Ser. No. 61/037,571 filed Mar. 18, 2008, the entirety of which is incorporated by reference herein.

TECHNICAL FIELD

The present disclosure generally relates to semiconductors and to epitaxial growth of semiconductor layers.

BACKGROUND

The term epitaxy in general describes an ordered crystalline growth of deposited layers. Epitaxial growth of a semiconductor layer has traditionally been achieved by growing a semiconductor material on top of a single crystal substrate, where the crystal lattice of the single crystal substrate matches the crystal lattice of the deposited semiconductor material. Epitaxial layers may be grown with vapor-phase epitaxy (VPE), a modification of chemical vapor deposition (CVD), liquid-phase epitaxy (LPE), and physical vapor deposition (PVD) (evaporative deposition, electron beam physical vapor deposition, sputter deposition, pulse laser deposition, chatodic-arc deposition, and ion beam physical vapor deposition). If a layer is deposited on a substrate of the same composition, the process is called homoepitaxy; otherwise it is called heteroepitaxy. Epitaxy is used in silicon-based manufacturing processes for bipolar junction transistors (BJTs) and modern complementary metal-oxide-semiconductor (CMOS). Epitaxy is also used in production of laser emitting diodes (LEDs) and in solar cells.

SUMMARY

The present invention involves the epitaxial growth of semiconductor layers on a substrate alternative to single crystal substrates that involves the use of a metallic interlayer having a closed-packed crystal structure. The following disclosure demonstrates how an epitaxial semiconductor layer can be grown on a glass, metal or plastic substrate. The disclosed invention and embodiments can be used to obviate the need for expensive single crystal substrates traditionally used to epitaxially grow semiconductor layers. In a particular implementation, this is achieved by deposition of an interlayer, which includes an amorphous or nano-crystalline seed-layer and one or more metallic layers with a close-packed crystal structure (e.g., face center cubic (fcc), hexagonal close-packed (hcp) or body center cubic (bcc)), on a substrate prior to sputtering a semiconductor layer. In a particular implementation, the metallic layers with a close-packed crystal structure are polycrystalline with the majority of crystals growing preferentially along a single crystal growth direction. This induces an ordered crystalline growth of grains in semiconductor layers on top of the interlayer structure. In one implementation, these epitaxially grown semiconductor layers can be used in solar cells. For example, this interlayer structure can also be used for epitaxial growth of p-type and n-type semiconductors in photovoltaic cells.

DESCRIPTION OF THE DRAWINGS

FIGS. 16a and 16b illustrate example photovoltaic cell structures according to various implementations of the invention

DESCRIPTION OF EXAMPLE EMBODIMENT(S)

Introduction—Layer Growth and Characterization

Figures 1A, 1B:
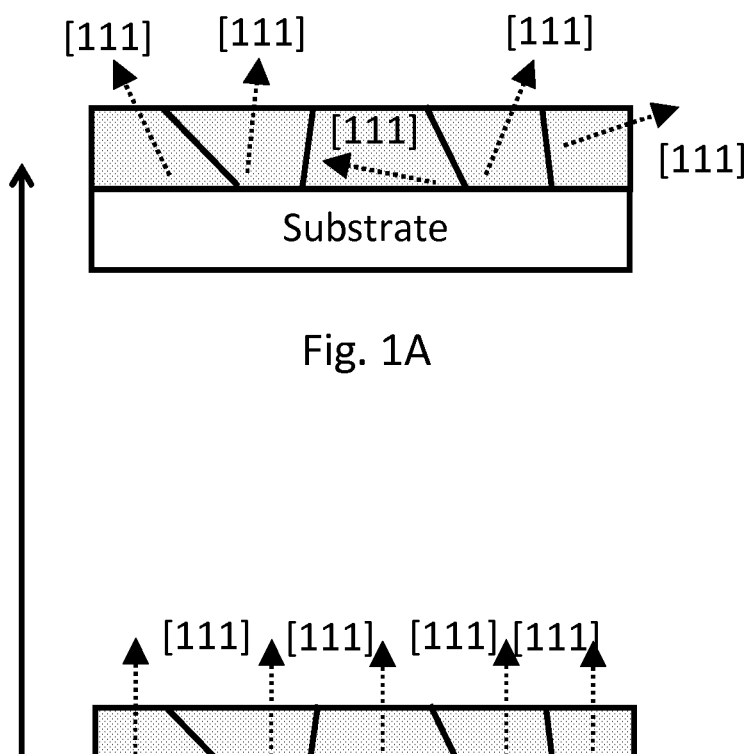
FIGS 1a and 1b illustrate examples of random and epitaxial (respectively) crystal growth direction of grains in a deposited layer perpendicular to the substrate surface.

If a deposited layer consists of grains with crystalline structure, each grain can grow along a different growth direction. The growth direction is defined as the crystal growth direction of grains in a deposited layer perpendicular to the substrate surface. For example, consider a layer that consists of grains with fcc crystal structure. These grains can grow along a single growth direction (for example [111], as shown in FIG. 1b) or along different growth directions (as shown in FIG. 1a). If the grains grow along a single growth direction, the growth is epitaxial and the layer is called an epitaxially-grown layer. Otherwise, if grains grow along different growth directions (see FIG. 1a, where [111] crystal direction of grains is oriented along different directions) the growth is random.

Crystal growth directions [111], [−111], [1-11], [11-1], [−1-11], [1-1-1], [−11-1], and [−1-1-1] are equivalent and collectively are referred to as <111> directions. In the following text, the notation <111> refers to all equivalent [111] directions, <0001> for all equivalent [0001] directions, and <110> for all equivalent [110] directions.

Figure 2:
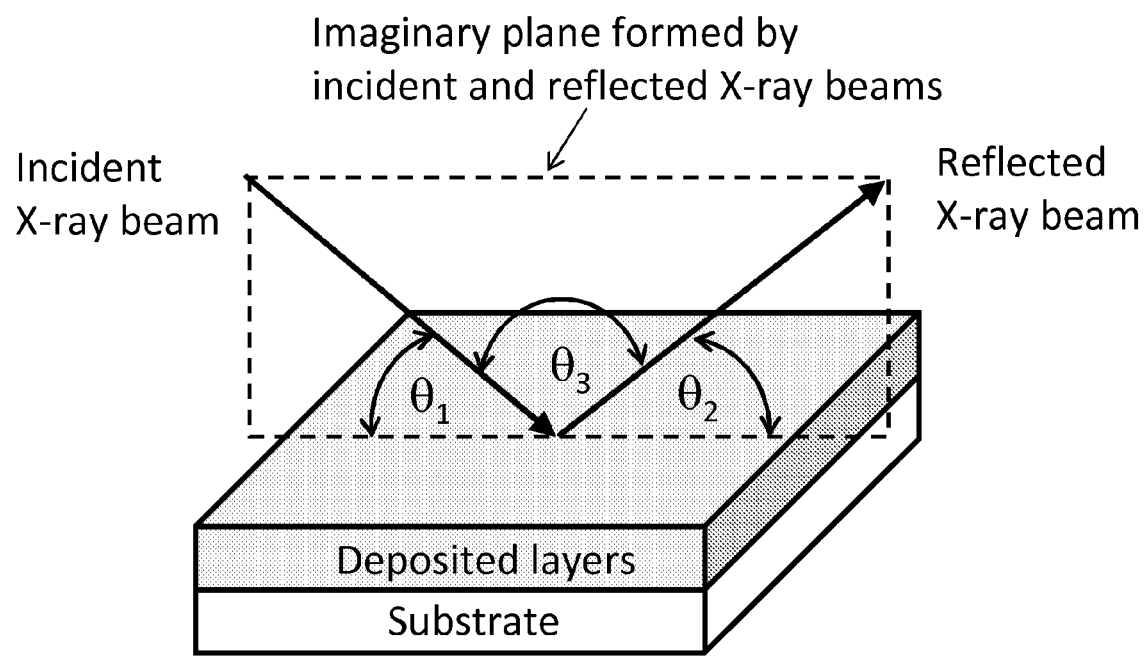
FIG. 2 illustrates example measurement geometries for X-ray structural characterization of deposited layers.

The structural characterization of deposited layers may be carried out by X-ray diffraction (XRD) using θ-2θ and rocking curve scans. Measurement geometry is described in FIG. 2. In a θ-2θ scan, the angle between an incident X-ray beam and the substrate surface, θ1, is the same as the angle between the reflected X-ray beam and the substrate surface, θ2, (θ1=θ2=θ). In the rocking curve scan, the angle between the incident and reflected beams, θ3, is kept constant (i.e., θ1+θ2 is kept constant) and the sample is rocked by angle ω, so that the angle between the incident X-ray beam and the substrate, θ1, varies(180-θ3)/2-ω/2 to (180-θ3)/2+ω/2. In both measurements, the imaginary plane formed by incident and diffracted X-ray beams, see FIG. 2, is perpendicular to the substrate surface. The θ-2θ scan can be used to detect the growth direction of grains in the deposited layer—i.e., crystal growth direction of grains in a deposited layer perpendicular to the substrate surface. The rocking curve scan can be used to determine the degree of alignment of the growth directions of grains with the direction normal to the substrate surface in the layer. The measure of alignment between the growth directions of grains in the layer is often expressed as the full width at half maximum (FWHM) of the peak obtained as a result of the rocking curve scan. This peak is narrow for a high degree of alignment between the growth directions of grains in the layer and is wide for a low degree of alignment between the growth directions of grains in the layer. Theory predicts FWHM of a single crystal on the order of 0.0030 for typical experimental conditions. However, most single crystals exhibit FWHM from 0.030 to 0.30.

Experimental Results

We grew a layer structure that includes: 1) an amorphous seed layer, 2) an fcc underlayer formed over the seed layer, and 3) a semiconductor layer formed over the fcc underlayer, all on top of a glass substrate (glass substrate/seed layer/fcc underlayer/semiconductor layer). After sputtering the fcc underlayer, and before sputtering the semiconductor layer, the glass substrate was heated to 300° C. We also grew a layer structure that includes: 1) an amorphous seed layer, 2) an fcc underlayer formed over the seed layer, 3) a bcc underlayer formed over the fcc underlayer, and 4) a semiconductor layer formed over the bcc underlayer. The substrate was heated to 300° C. after sputtering the fcc underlayer and before sputtering the bcc underlayer. In this particular experiment, argon, Ar, was used as the sputter gas. However, other gases—such as helium (He), neon (Ne), krypton (Kr), xenon (Xe), nitrogen ($N_2$), oxygen ($O_2$) and/or hydrogen (H)—can also be used.

FIG. 3a to FIG. 5b show $\theta$-$2\theta$ and rocking curve scans obtained from the following layer structures: 1) Seed layer/Au fcc underlayer/Heat/Si semiconductor layer, 2) Seed layer/Ni fcc underlayer/Heat/Si semiconductor layer and 3) Seed layer/Au fcc underlayer/Heat/Mo bcc underlayer/Si semiconductor layer. In structure 1) Seed layer/Au/Heat/Si and structure 3) Seed layer/Au/Heat/Mo/Si, the grains of the Si layer grows along <111> growth directions. The term "Heat" in the structures described above refers to the heating of the substrate to a desired temperature (e.g., 300 C) prior to depositing a succeeding layer. The presence of the Mo layer between Au and Si in structure 3) [Seed layer/Au/Heat/Mo/Si] improves growth of Si grains along <111> crystal directions. This was deduced from rocking curve scans presented in FIG. 1b, and FIG. 3b that show that FWHM of <111> directions is reduced from 1.1° in structure 1) Seed layer/Au/Heat/Si, to 0.23° in structure 3) Seed layer/Au/Heat/Mo/Si. In the structure 3) [Seed layer/Au/Heat/Mo/Si], the growth directions of the Si layer is as good as in some single crystal structures. This shows that this seed layer/underlayer structure can be used to achieve highly directional epitaxial growth of the Si layer. Previously, highly directional epitaxial growth has been achieved only by growing Si on top of a single crystal substrate. In structure 2) [Seed layer/Ni/Heat/Si], Si grows along <220> growth directions. The Si layer is also highly oriented; FWHM of Si <220> is 3.95°.

Figure 3A:
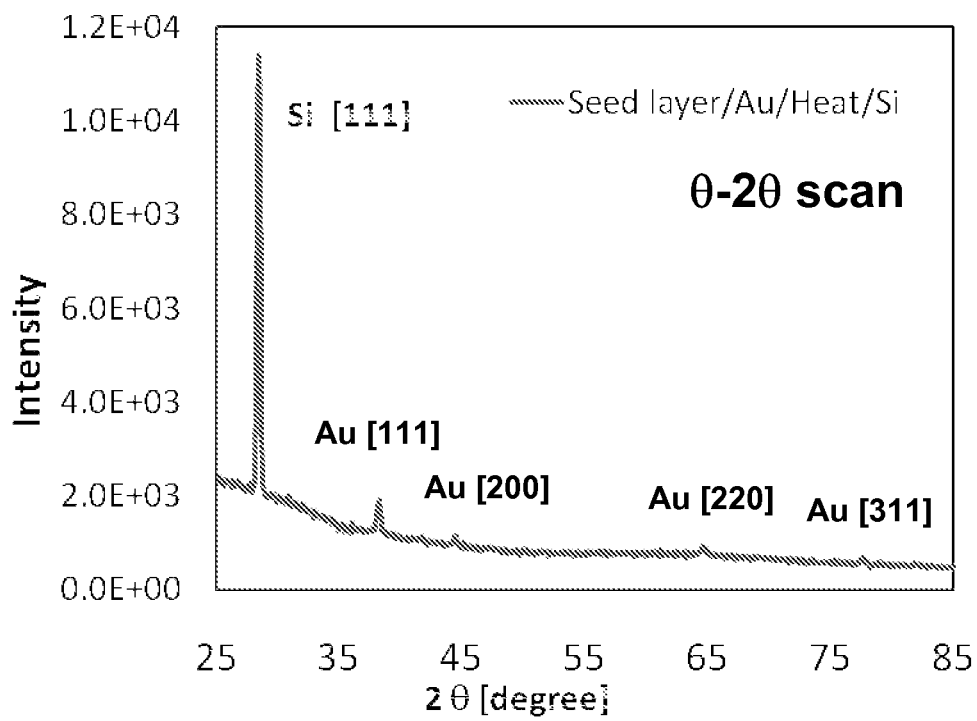
FIGS. 3a, 3b, 4a, 4b, 5a, and 5b are plots illustrating the results of θ-2θ and rocking curve scans of epitaxially grown semiconductor layers.
Figure 3B:
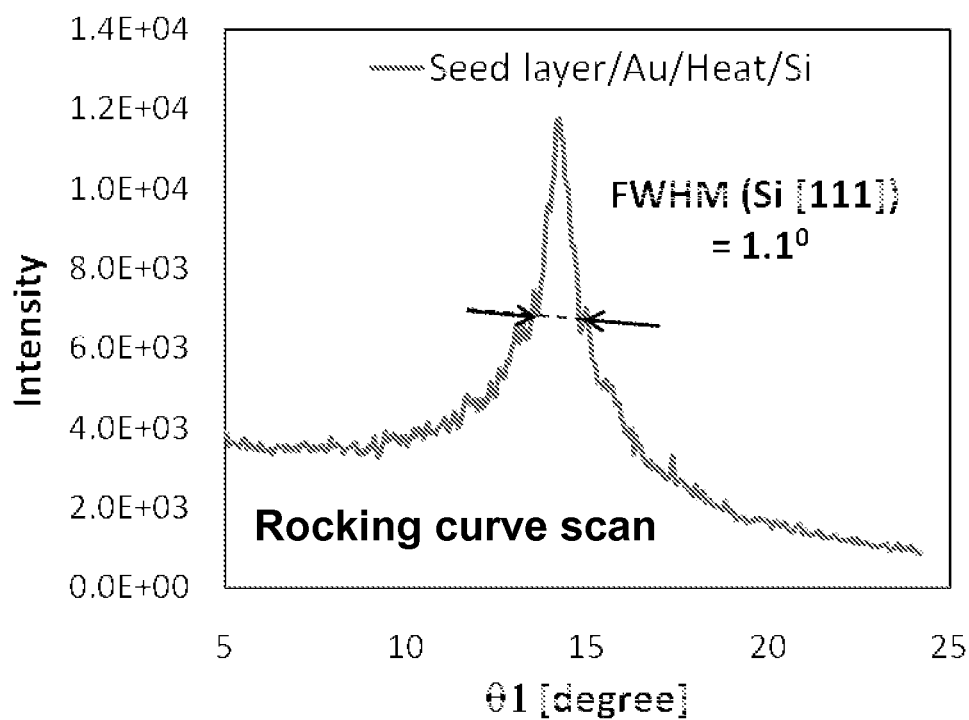
Figure 4A:
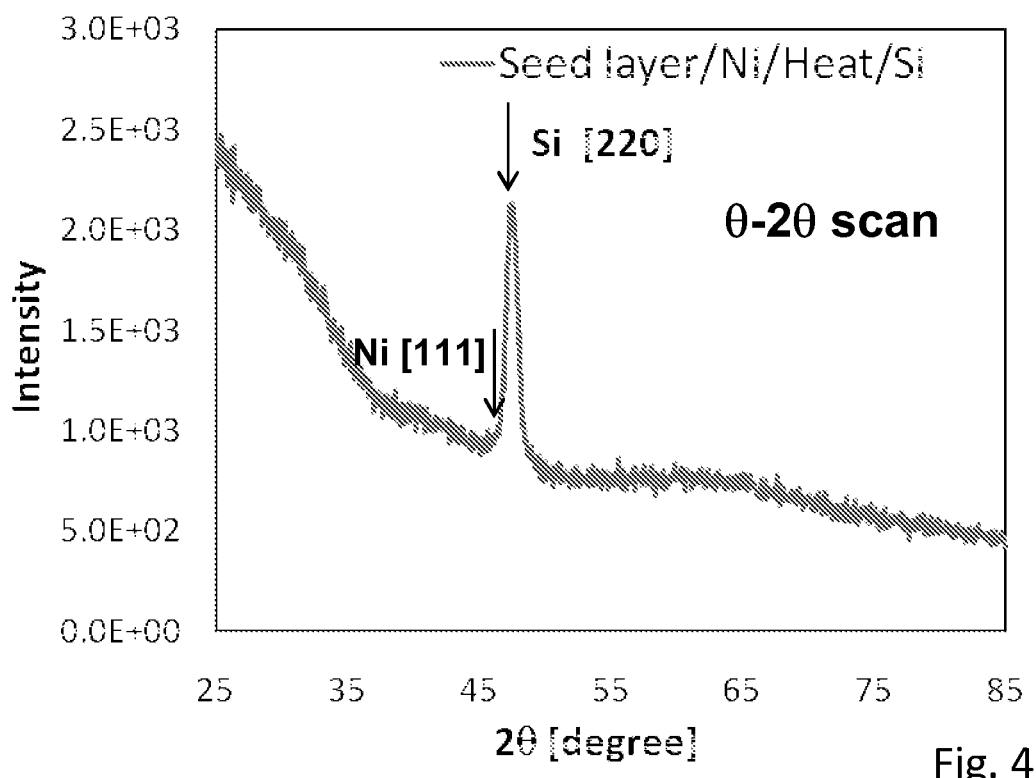
Figure 4B:
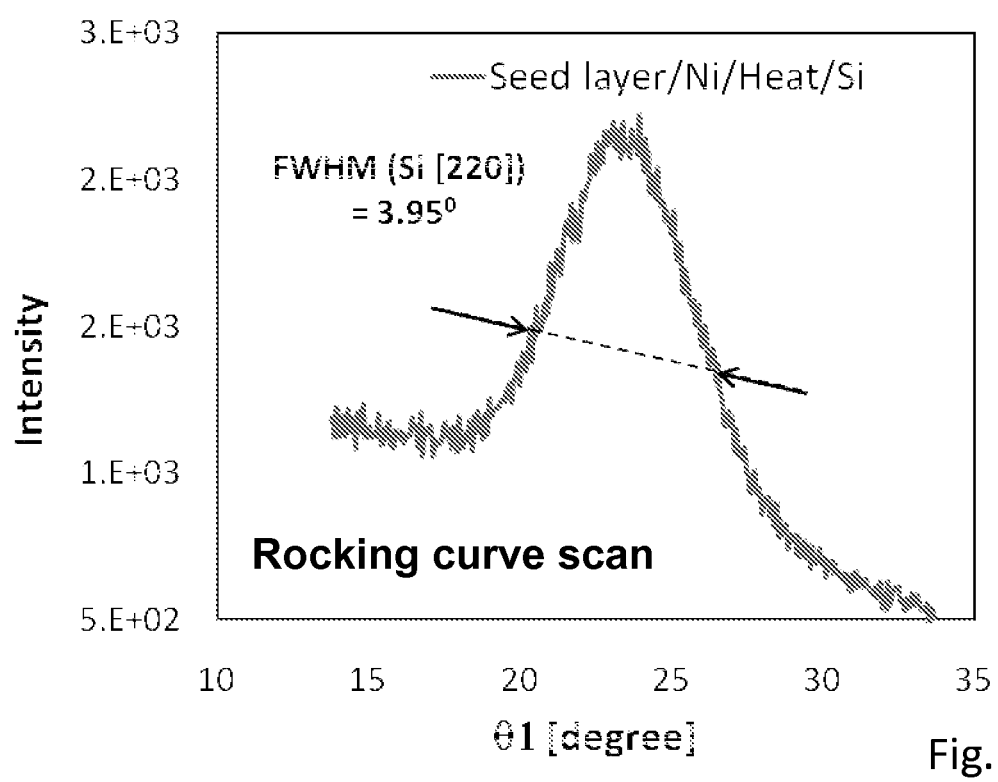
Figure 5A:
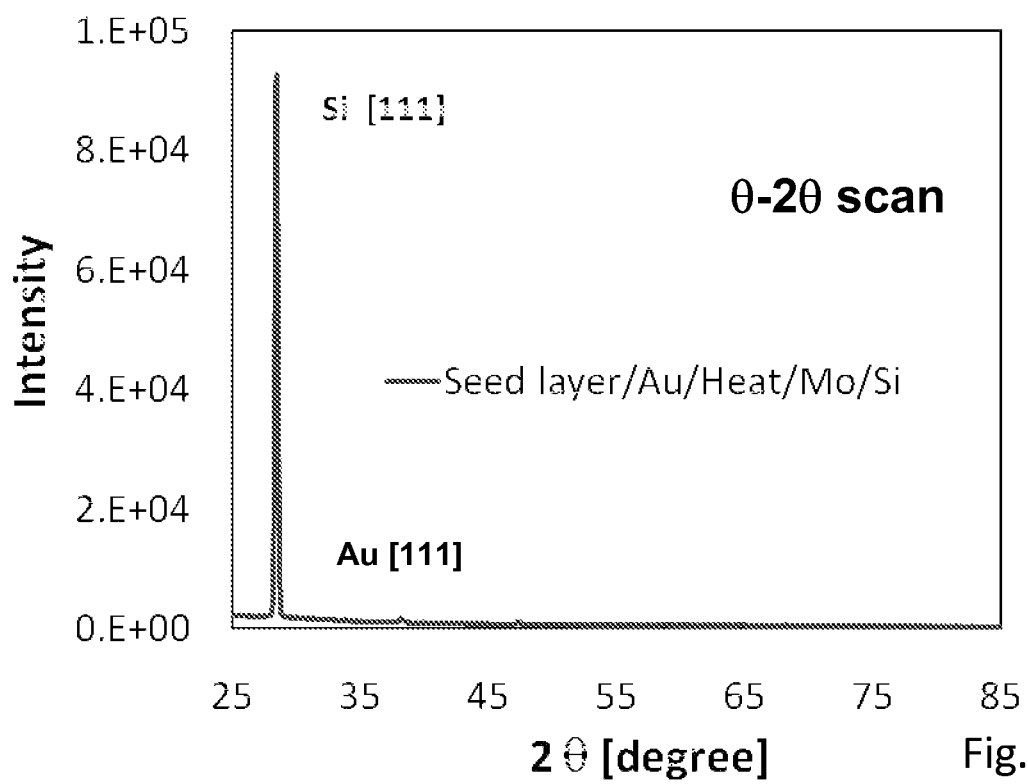
Figure 5B:
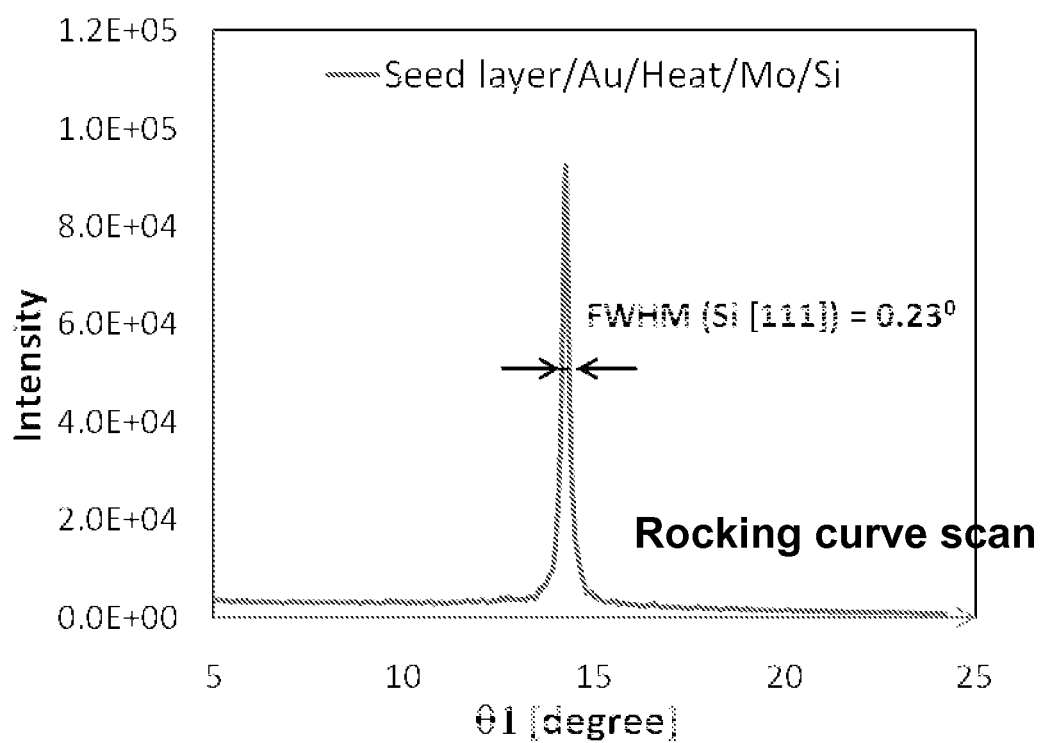
Figure 6:
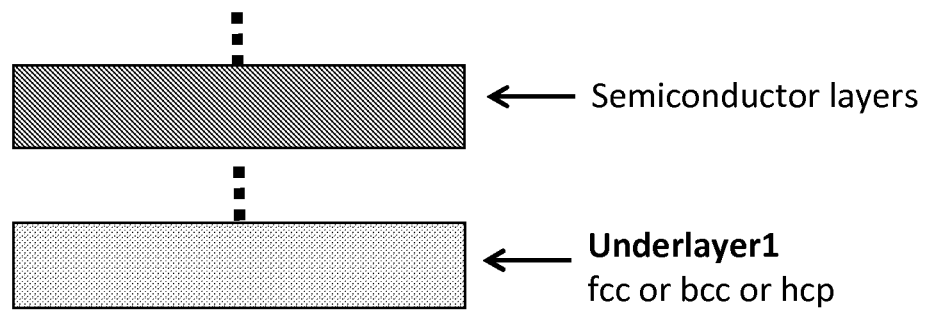
FIG. 6 to 13 set forth various example layer structures that can be used to promote epitaxial growth of a semiconductor layer.
Figure 7:
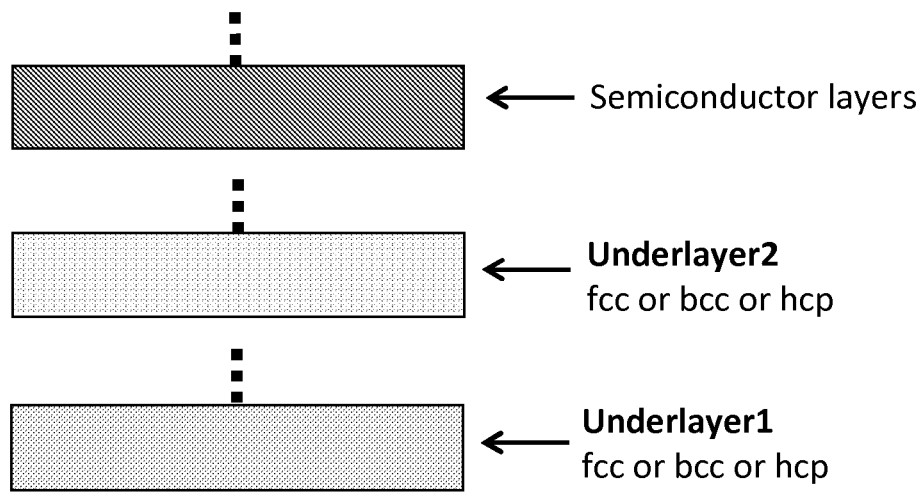
Figure 8:
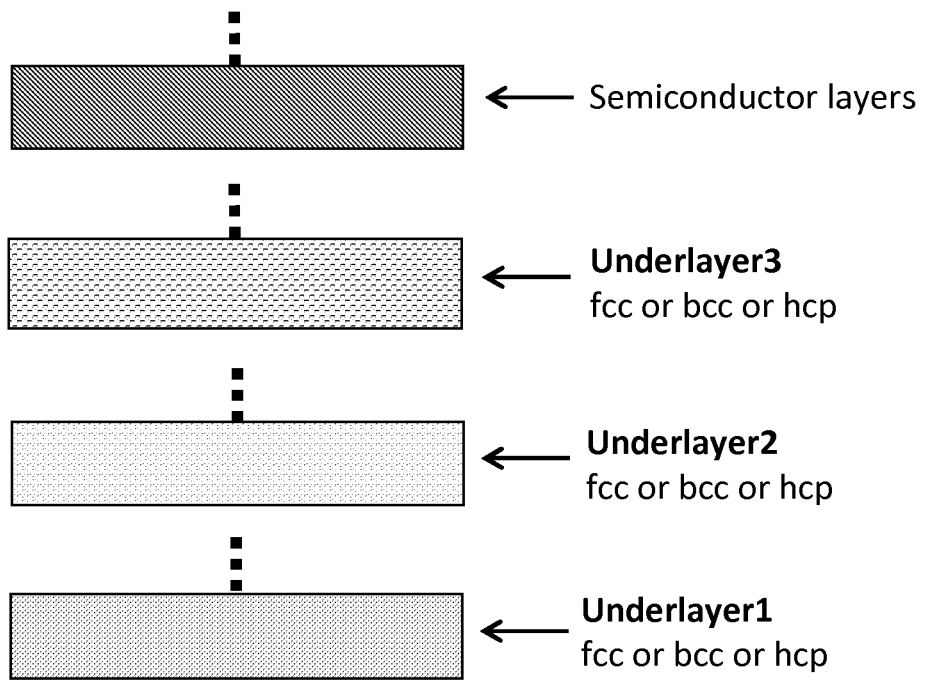
Figure 9:
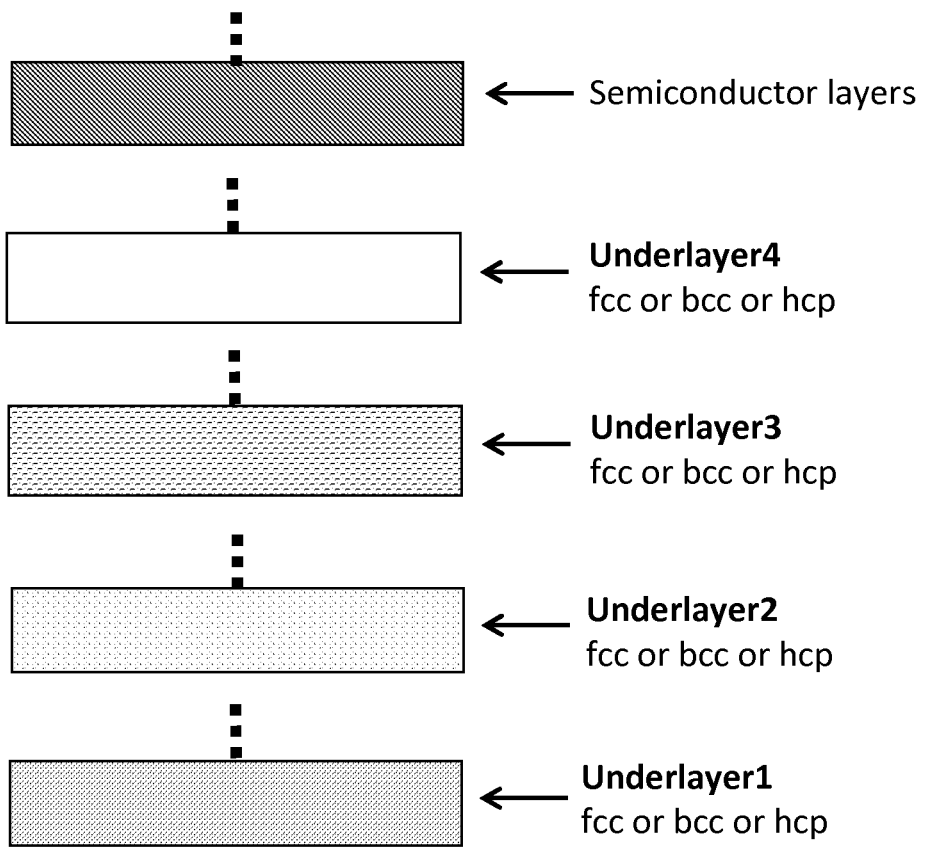
Figure 10:
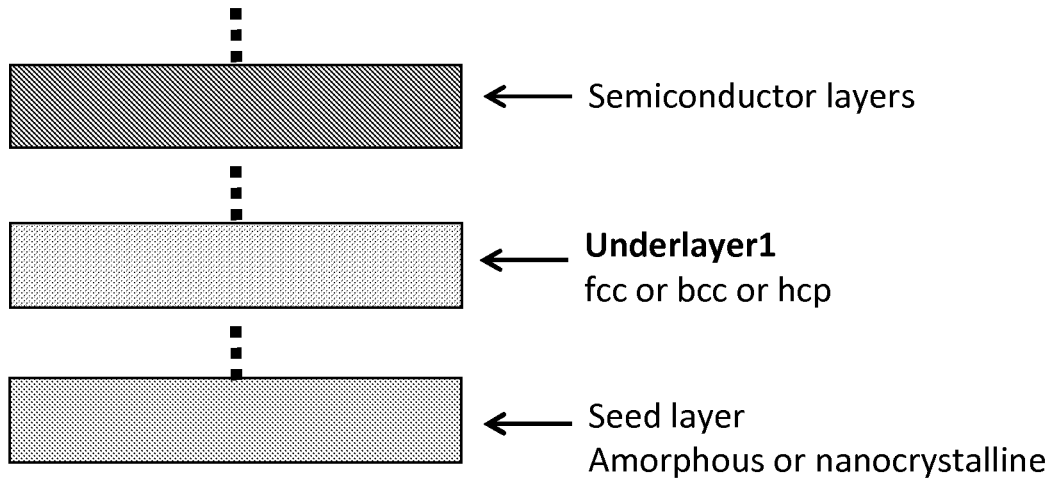
Figure 11:
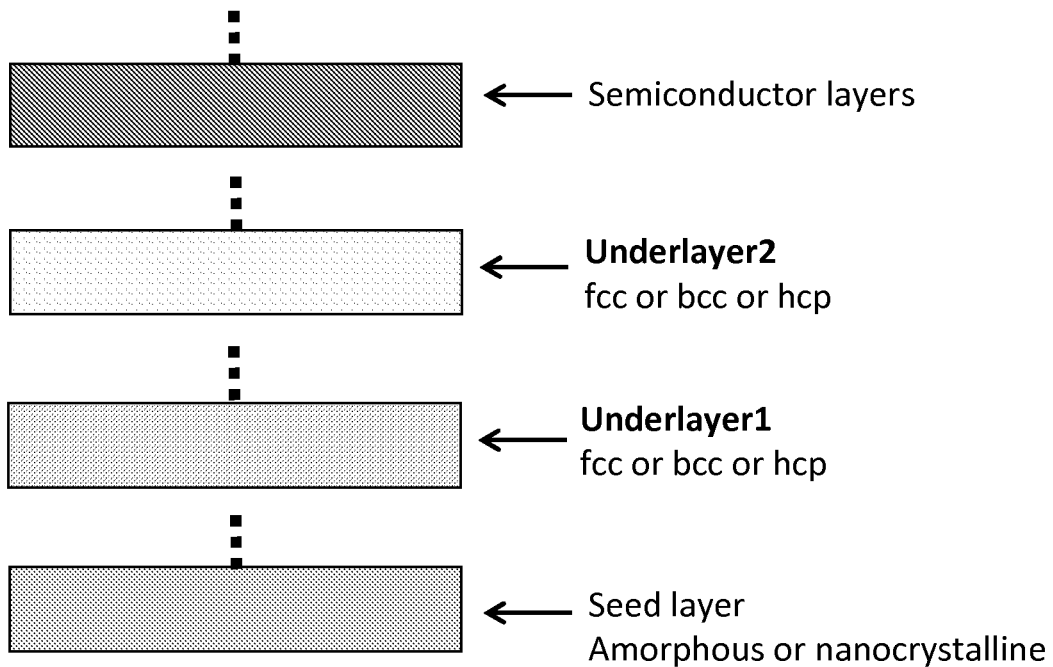
Figure 12:
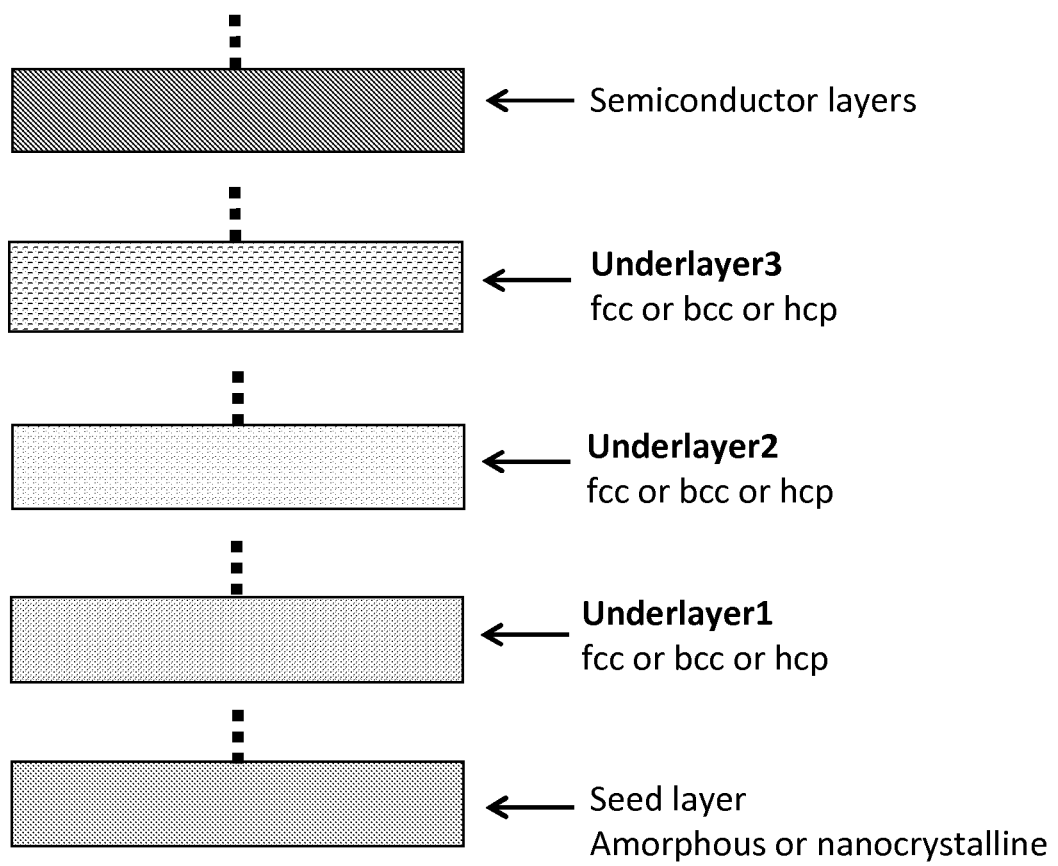

In the investigated structures 1) Seed layer/Au/Heat/Si, 2) Seed layer/Ni/Heat/Si and 3) Seed layer/Au/Heat/Mo/Si, both Au and Ni grow preferentially along <111> growth directions, while Mo grows preferentially along the <110> direction. FIG. 3a shows that majority of Au grains grow along <111> direction but some of Au grains also grow along <200>, <220> and <311> directions. In the structure 3) Seed layer/Au/Heat/Mo/Si the Mo layer is thin, so <110> Mo growth direction cannot be detected from FIG. 5a. Both Ni and Au have fcc crystal structures; however, Au has a larger lattice constant, a, than Ni (a(Ni)=0.3524 nm and a(Au)=0.4079 nm). Thus, the size of the lattice constant may be important in determining the growth direction of Si layer.

Heat may also be an important sputter parameter for Si layer growth. If we grow 1) Seed layer/Au/Si, and 2) Seed layer/Ni/Si layer structures at room temperature, $\theta$-$2\theta$ scans do not show any Si diffraction peaks. This indicates that Si has an amorphous or nanocrystalline structure. Also, the presence of heat may be necessary for obtaining epitaxial growth of some semiconductor layers. As described above, the substrate may be heated to at least 200° C. (e.g. 300° C.), for example, prior to sputtering an Si semiconductor layer. Heating can be also used to increase the grain size of underlayers and semiconductors that may be desired in some applications.

Example Structures for Promoting Epitaxial Growth

Figure 13:
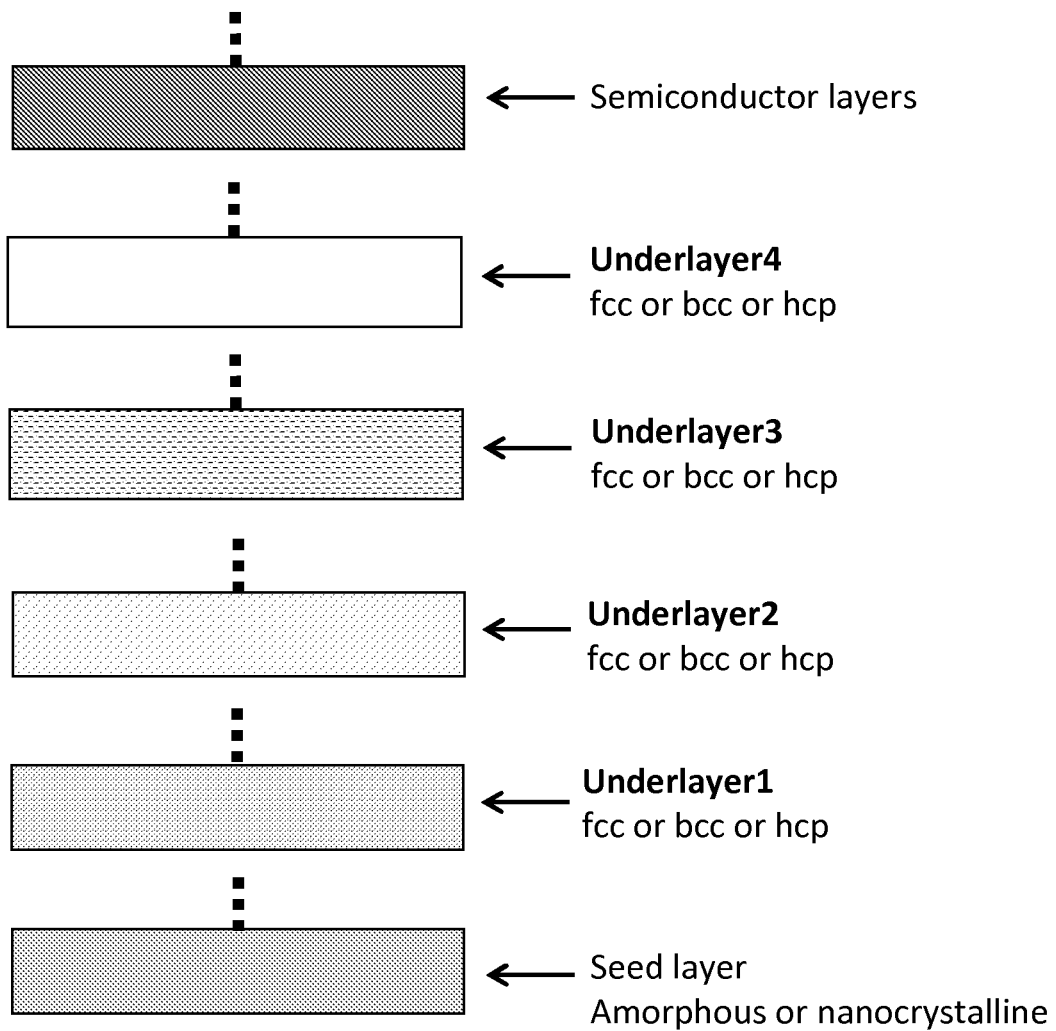

The following describes various layer structures that can be used to promote epitaxial growth of a semiconductor layer. FIG. 6 to FIG. 13 illustrate structures that may be used to set epitaxial growth of a semiconductor on top of a non-single-crystal substrate:

1) Underlayer1/semiconductor layers (FIG. 6);
2) Underlayer1/Underlayer2/semiconductor layers (FIG. 7);
3) Underlayer1/Underlayer2/Underlayer3/semiconductor layers (FIG. 8);
4) Underlayer1/Underlayer2/Underlayer3/Underlayer4/semiconductor layers (FIG. 9);
5) Seed layer/Underlayer1/semiconductor layers (FIG. 10);
6) Seed layer/Underlayer1/Underlayer2/semiconductor layers (FIG. 11);
7) Seed layer/Underlayer1/Underlayer2/Underlayer3/semiconductor layers (FIG. 12); and
8) Seed layer/Underlayer1/Underlayer2/Underlayer3/Underlayer4/semiconductor layers (FIG. 13).

Underlayer1 consists of at least one fcc, hcp or bcc layer. For example, Underlayer1 may include one or more deposited layers of an fcc, hcp or bcc crystal structure. Similarly, Underlayer2 consists of at least one fcc, hcp or bcc layer. Underlayer3 consists of at least one fcc, hcp or bcc layer. Underlayer4 consists of at least one fcc, hcp or bcc layer. Some specific example of structures illustrated in FIG. 6 to 13 with crystal growth directions are shown in FIG. 14a to FIG. 14l. In structures illustrated in FIG. 6 to 13, heat may be used before sputtering Underlayer1, Underlayer2, Underlayer3, and/or Underlayer4. In the structures illustrated in FIG. 10 to 13, heat may cause crystallization of an amorphous layer. This can affect growth of the underlayer on top of the Seed layer. To avoid growth of an underlayer on top of an already-crystallized Seed layer, at least one underlayer may be deposited on top of the Seed layer before heating the substrate.

In an fcc layer, at least 50% of the grains have an fcc crystal structure. The fcc layer can also consist of at least 50% of grains with fcc crystal structure surrounded with an oxide grain matrix; in other words, oxide is dispersed at the grain boundaries of the semiconductor fcc grains. U.S. application Ser. Nos. 12/016,172, 11/923,036, and 11/923,070 all of which are incorporated by reference herein in their entirety for all purposes, disclose the structure and deposition of one or more granular semiconductor and oxide layers with nanometer-size semiconductor grains surrounded by a matrix of oxide. These granular semiconductor and oxide layers may be deposited on top of the underlayer structures disclosed herein. For purpose of improving segregation of oxide in grain boundaries in the semiconductor and oxide layers, the metallic underlayers may consist of metal and oxide material, where grains of metal material have a fcc, hcp or bcc crystal structure. In an hcp layer, at least 50% of grains have hcp crystal structure. The hcp layer can also consist of at least 50% of grains with hcp crystal structure surrounded by an oxide grain matrix. In a bcc layer, at least 50% of grains have bcc crystal structure. The bcc layer can also consist of at least 50% of grains with bcc crystal structure surrounded with an oxide grain matrix.

The following sets forth four possible compositions of an fcc layer according to various embodiments of the invention:

1) A fcc underlayer may comprise at least one element from the group consisting of Al, Ni, Cu, Rh, Pd, Ag, Ir, Pt, Au, Pb.

2) A fcc underlayer may comprise at least one element from the group consisting of Al, Ni, Cu, Rh, Pd, Ag, Ir, Pt, Au, Pb; and at least one element from the group consisting of B, C, N, O, Na, Si, S, P, K, Sc, Ti, V, Cr, Mn, Fe, Co, Zn, Ga, Ge, Se, Y, Zr, Nb, Mo, Ru, Cd, In, Sn, Sb, Te, Hf, Ta, W, Re, Bi.

3) A fcc underlayer may comprise at least one element from the group consisting of Al, Ni, Cu, Rh, Pd, Ag, Ir, Pt, Au, Pb; and at least one oxide material selected from group consisting of: magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

4) A fcc underlayer may also comprise at least one element from the group consisting of Al, Ni, Cu, Rh, Pd, Ag, Ir, Pt, Au, Pb; at least one element from the group consisting of B, C, N, O, Na, Si, S, P, K, Sc, Ti, V, Cr, Mn, Fe, Co, Zn, Ga, Ge, Se, Y, Zr, Nb, Mo, Ru, Cd, In, Sn, Sb, Te, Hf, Ta, W, Re, Bi; and at least one oxide material selected from group consisting of: magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

The following sets forth four possible compositions of the hcp layer:

1) A hcp underlayer may comprise at least one element from the group consisting of Sc, Ti, Co, Zn, Y, Zr, Ru, Hf, Re.

2) A hcp underlayer may comprise at least one element from the group consisting of Sc, Ti, Co, Zn, Y, Zr, Ru, Hf, Re; and at least one element from the group consisting of B, C, N, O, Na, Si, S, P, K, Al, V, Cr, Mn, Fe, Ni, Cu, Ga, Ge, Se, Nb, Mo, Rh, Pd, Ag, Cd, In, Sn, Sb, Te, Ta, W, Ir, Pt, Au, Bi.

3) A hcp underlayer may comprise at least one element from the group consisting of Sc, Ti, Co, Zn, Y, Zr, Ru, Hf, Re; and at least one oxide material selected from group consisting of: magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

4) A hcp underlayer may also comprise at least one element from the group consisting of Sc, Ti, Co, Zn, Y, Zr, Ru, Hf, Re; at least one element from the group consisting of B, C, N, O, Na, Si, S, P, K, Al, V, Cr, Mn, Fe, Ni, Cu, Ga, Ge, Se, Nb, Mo, Rh, Pd, Ag, Cd, In, Sn, Sb, Te, Ta, W, Ir, Pt, Au, Bi; and at least one oxide material selected from group consisting of: magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

The following sets forth four possible compositions of bcc layer:

1) A bcc underlayer may comprise at least one element from the group consisting of V, Cr, Fe, Nb, Mo, Ta, W.

2) A bcc underlayer may comprise at least one element from the group consisting of V, Cr, Fe, Nb, Mo, Ta, W; and at least one element from the group consisting of B, C, N, O, Na, Si, S, P, K, Sc, Ti, Mn, Co, Ni, Cu, Zn, Ga, Ge, Se, Y, Zr, Ru, Rh, Pd, Ag, Cd, In, Sn, Sb, Te, Hf, Re, Ir, Pt, Au, Bi.

3) A bcc underlayer may comprise at least one element from the group consisting of V, Cr, Fe, Nb, Mo, Ta, W; and at least one oxide material selected from group consisting of: magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

4) A bcc underlayer may also comprise at least one element from the group consisting of V, Cr, Fe, Nb, Mo, Ta, W; at least one element from the group consisting of B, C, N, O, Na, Si, S, P, K, Sc, Ti, Mn, Co, Ni, Cu, Zn, Ga, Ge, Se, Y, Zr, Ru, Rh, Pd, Ag, Cd, In, Sn, Sb, Te, Hf, Re, Ir, Pt, Au, Bi; and at least one oxide material selected from group consisting of: magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

Seed layer comprises at least one layer with amorphous or nanocrystalline structure. The following sets forth possible compositions of seed layer:

1) Seed layer may comprise of silicon nitride $Si_3N_4$.
2) Seed layer may comprise at least one element from the group consisting of V, Cr, Mn, Fe, Co, Ni; and at least one element from the group consisting of B, C, Al, Si, P, Sc, Ti, Cu, Zn, Ga, Ge, Sr, Y, Zr, Nb, Mo, Ru, Rh, Pd, Ag, In, Sn, Te, Hf, Ta, W, Re, Ir, Pt, Au.
3) Seed layer may be composed of 10 to 96 at. % of least one element from the group consisting of V, Cr, Mn, Fe, Co, Ni; and 4 to 50 at. % of least one element from the group consisting of B, C, P, Si, Ti, Ge, Zr, Mo, Hf, Ta, W.
4) Seed layer may be composed of 10 to 90 at. % of least one element from the group consisting of V, Cr, Mn, Fe, Co, Ni; 4 to 50 at. % of least one element from the group consisting of B, C, P, Si, Ti, Ge, Zr, Mo, Hf, Ta, W; and at least one element from the group consisting of Al, Sc, Cu, Zn, Ga, Sr, Y, Ru, Rh, Pd, Ag, In, Sn, Te, Re, Ir, Pt, Au.

Solar Cell Structures with Epitaxially-Grown Semiconductor Layers

Figure 15:
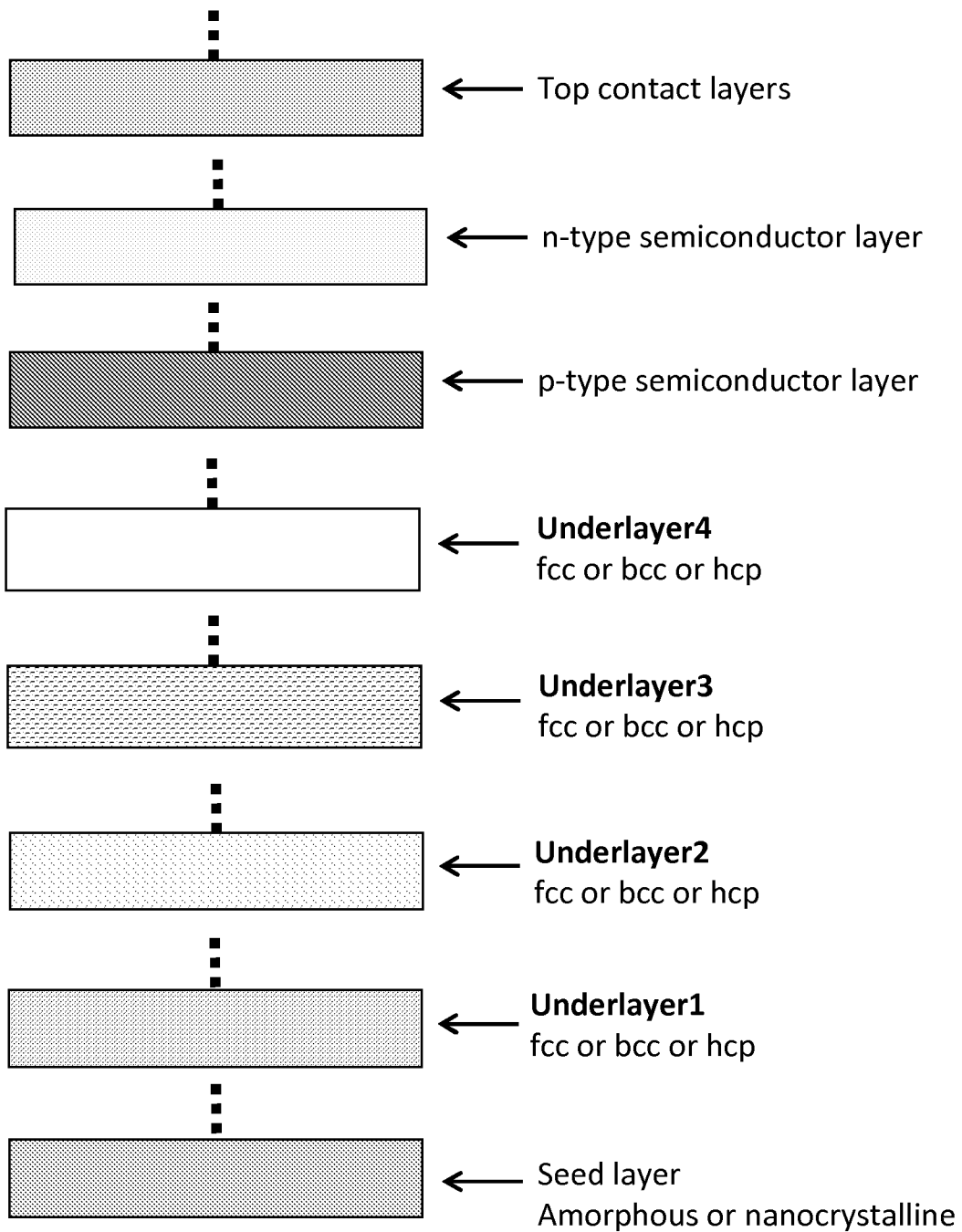
FIG. 15 illustrates example layer structures with epitaxially-grown semiconductor layers that can be used in solar sells.

The structures discussed above for promoting epitaxial growth of semiconductor layers may be used in solar cells as illustrated in FIGS. 15, 16a and 16b. Solar cells with epitaxially grown semiconductor layers may comprise one of the following example layer structures:
1) Underlayer1/semiconductor layers/top conductive and transparent layers;
2) Underlayer1/Underlayer2/semiconductor layers/top conductive layers;
3) Underlayer1/Underlayer2/Underlayer3/semiconductor layers/top conductive and transparent layers;
4) Underlayer1/Underlayer2/Underlayer3/Underlayer4/semiconductor layers/top conductive and transparent layers;
5) Seed layer/Underlayer1/semiconductor layers/top conductive and transparent layers;
6) Seed layer/Underlayer1/Underlayer2/semiconductor layers/top conductive and transparent layers;
7) Seed layer/Underlayer1/Underlayer2/Underlayer3/semiconductor layers/top conductive and transparent layers; and
8) Seed layer/Underlayer1/Underlayer2/Underlayer3/Underlayer4/semiconductor layers/top conductive and transparent layers.

Figure 14A:
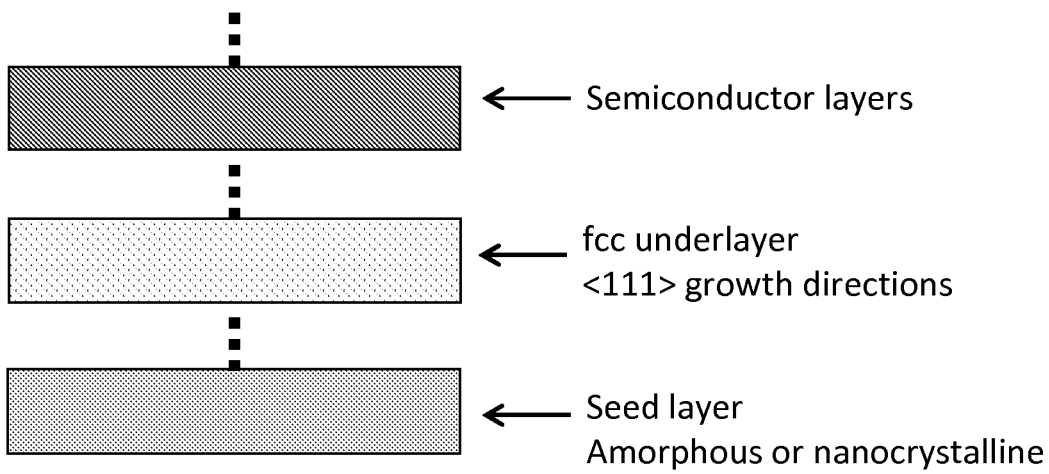
FIG. 14a to 14l illustrate example layer structures with crystal growth directions.
Figure 14B:
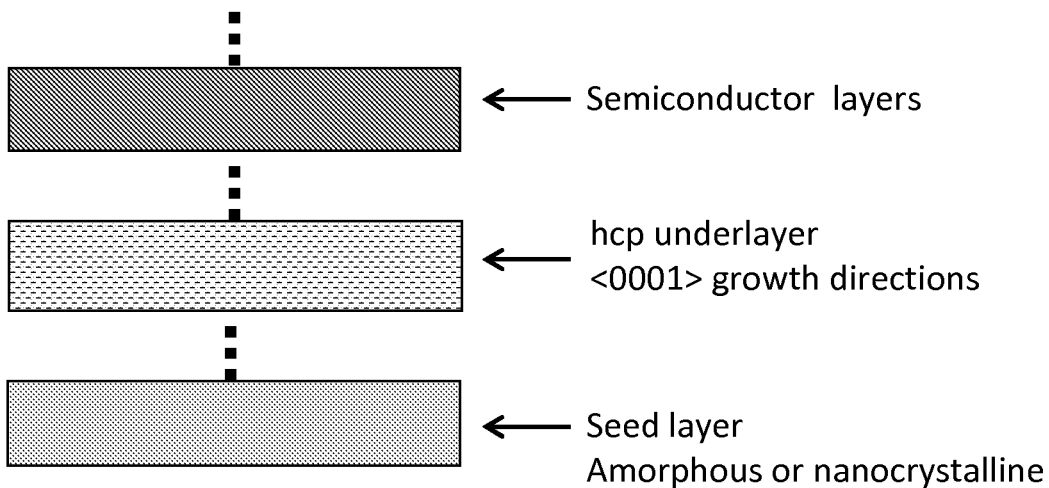
Figure 14C:
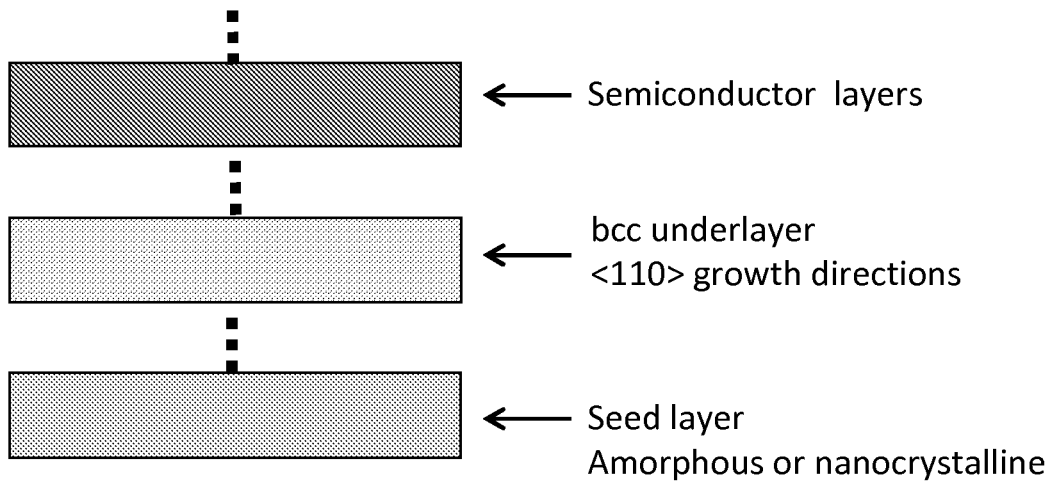
Figure 14D:
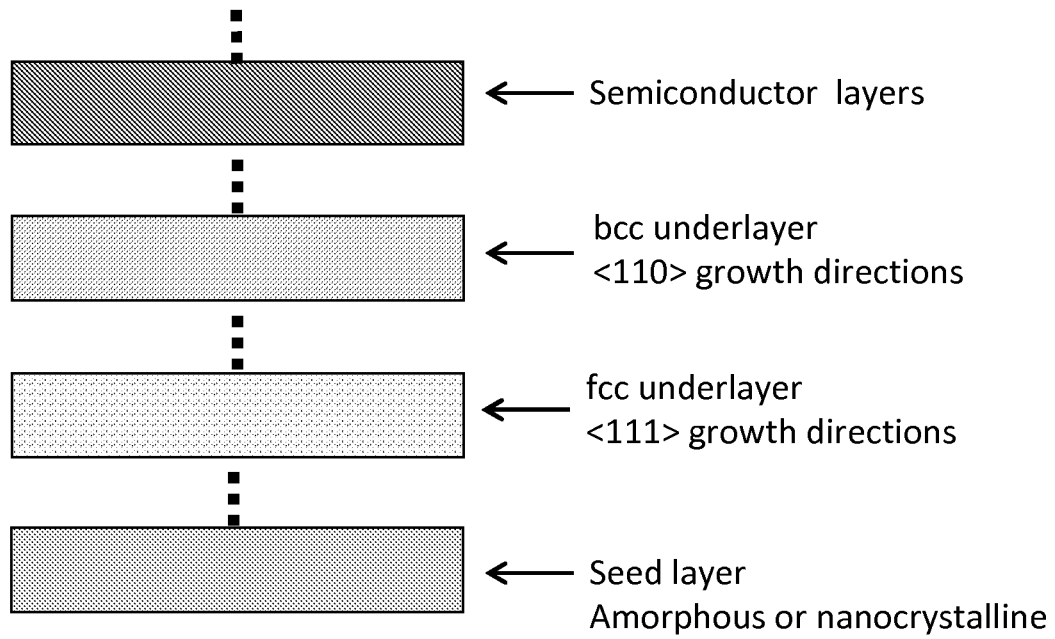
Figure 14E:
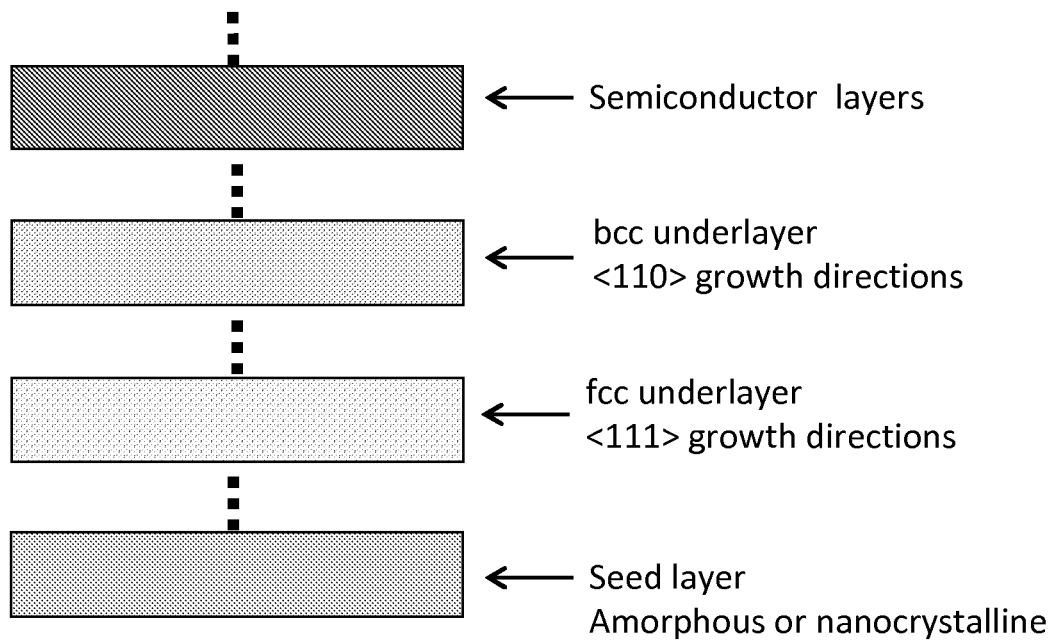
Figure 14F:
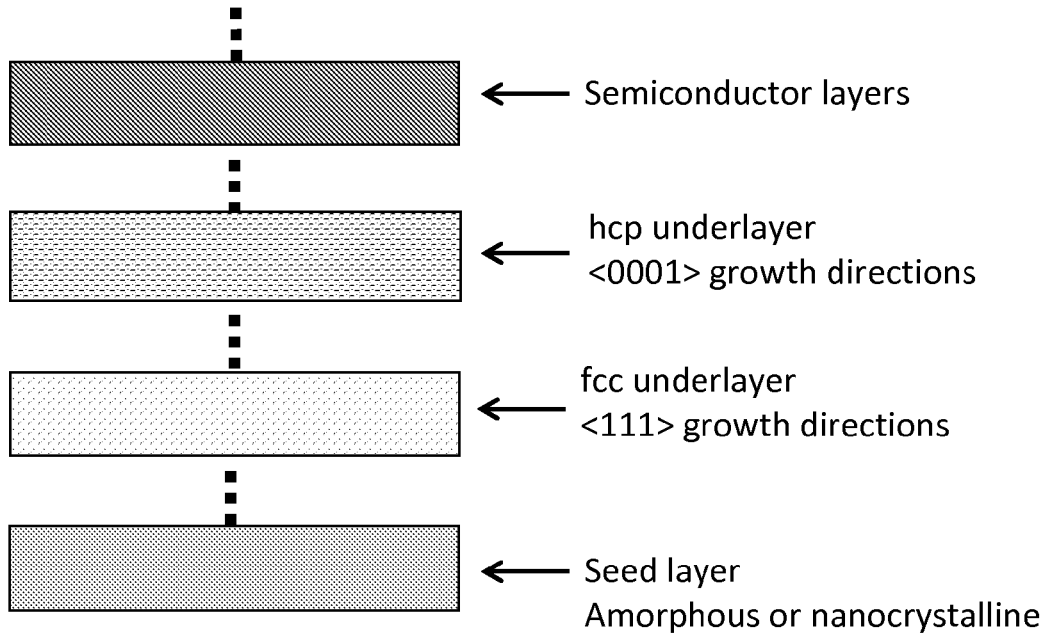
Figure 14G:
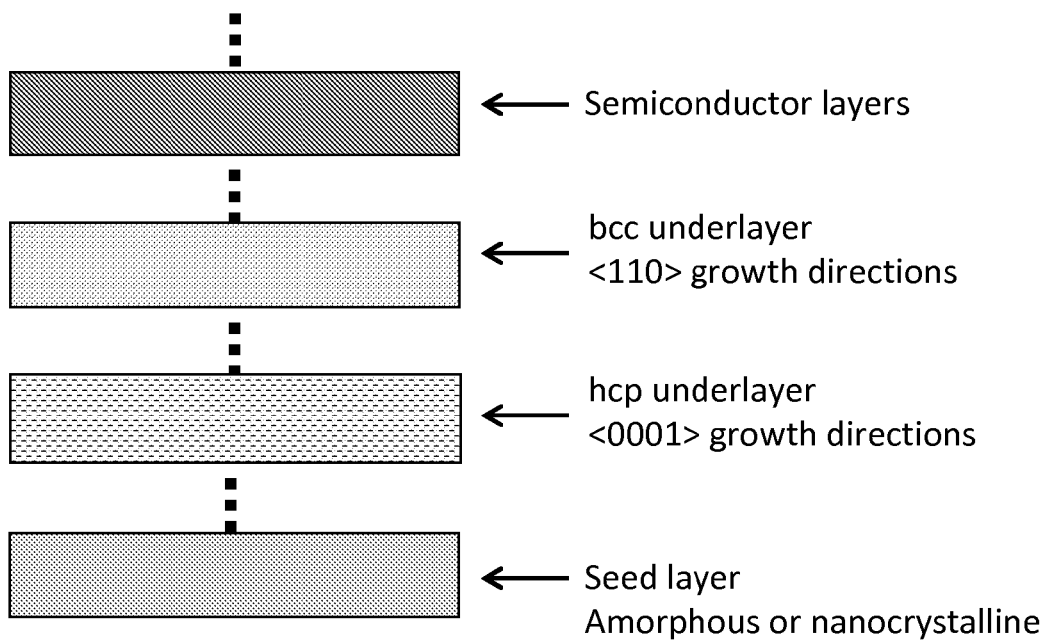
Figure 14H:
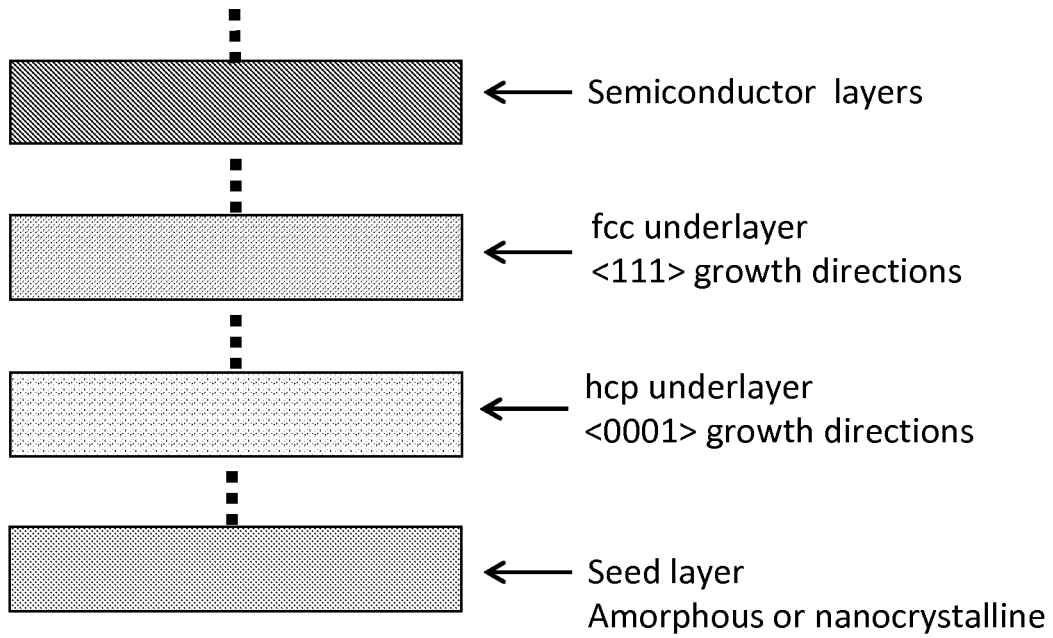
Figure 14I:
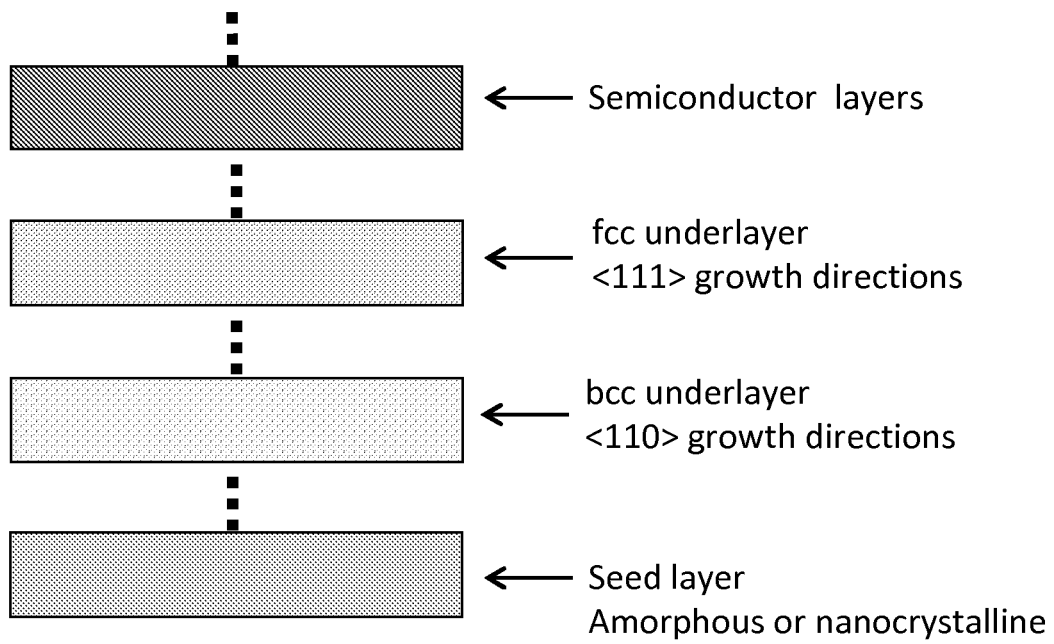
Figure 14J:
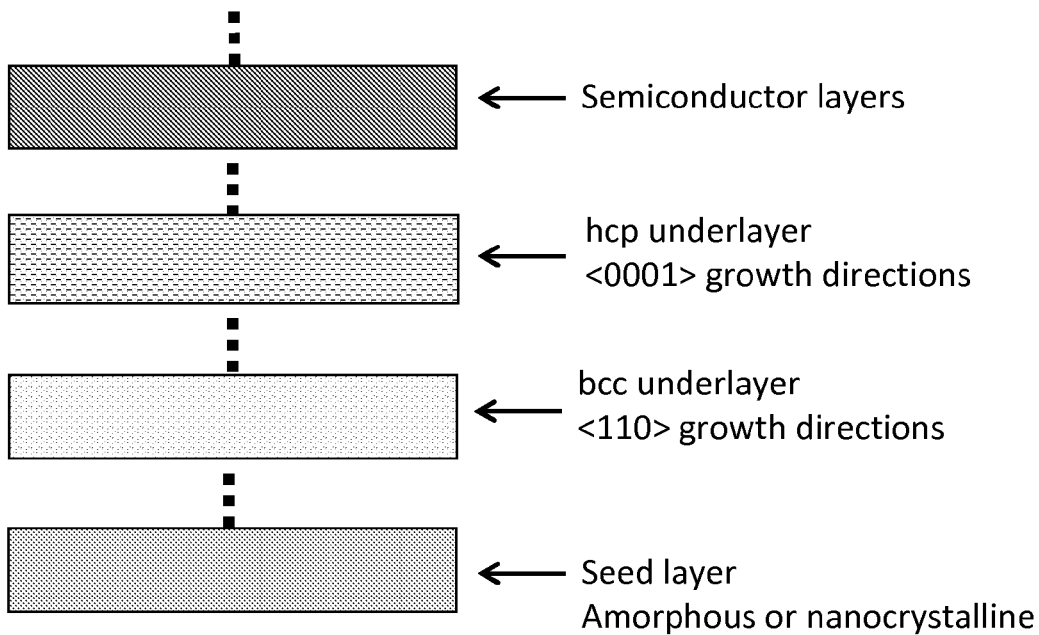
Figure 14K:
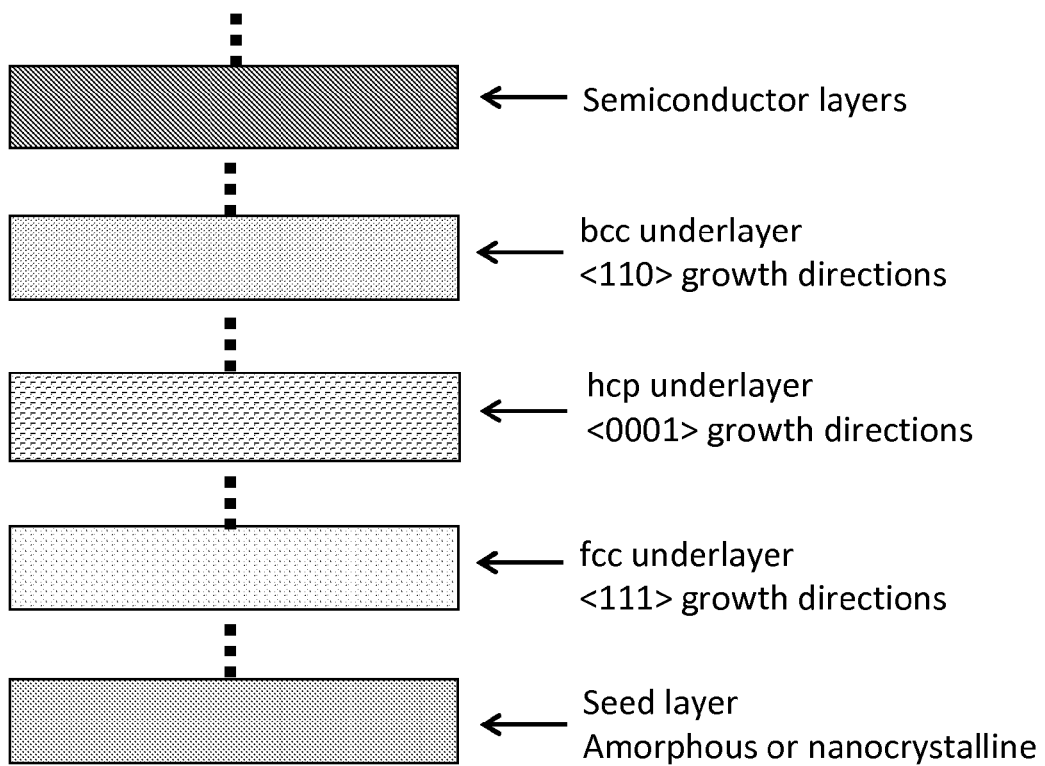
Figure 14L:
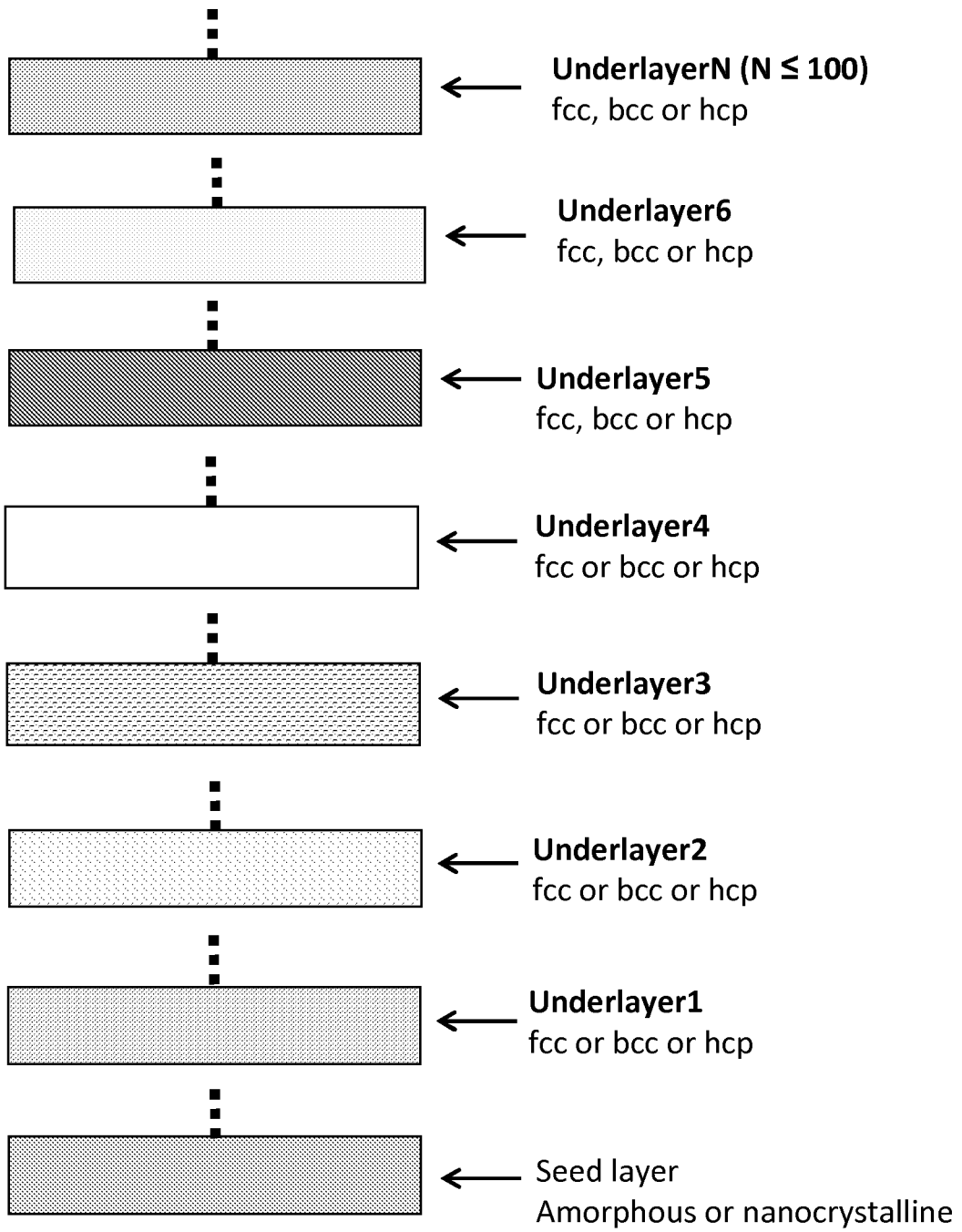

Up to 100 underlayers can be used to promote desired crystallographic orientation of semiconductor layer as shown in FIG. 14l.

The semiconductor layers in the solar cells may include at least one p-type semiconductor layer, and at least one n-type semiconductor layer (see example FIG. 15). One or more of the semiconductor layers can be composed of an intrinsic semiconductor material. FIG. 15 shows an n-type semiconductor layer disposed over a p-type semiconductor layer. In other implementations, p-type semiconductor layers may be disposed over n-type semiconductor layers. In addition, U.S. application Ser. Nos. 12/016,172, 11/923,036, and 11/923,070 all of which are incorporated by reference herein in their entirety for all purposes, disclose additional layer arrangements and configurations for photovoltaic cell structures that can be incorporated into embodiments of the invention.

The semiconductor layers may include at least one semiconductor material selected from the group consisting of silicon (Si), germanium (Ge), tin (Sn), beta iron silicide (β-FeSi$_2$), indium antimony (InSb), indium arsenic (InAs), indium phosphate (InP), gallium phosphate (GaP), aluminum phosphate (AlP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide ($Cu_{1-x}S$ (x varies from 1 to 2)), copper selenide ($Cu_{1-x}Se$ (x varies from 1 to 2)), copper indium disulfide ($CuInS_2$), copper gallium disulfide ($CuGaS_2$), copper indium gallium disulfide, ($Cu(In_{1-x}Ga_x)S_2$ (x varies from 0 to 1)), copper indium diselenide ($CuInSe_2$), copper gallium diselenide ($CuGaSe_2$), copper indium gallium diselenide ($Cu(In_{1-x}Ga_x)Se_2$ (x varies from 0 to 1)), copper silver indium gallium disulfide-($Cu_{1-x}Ag_x$)($In_{1-y}Ga_y$)$S_2$ (x varies from 0 to 1, y varies from 0 to 1)), copper silver indium gallium diselenide ($Cu_{1-x}Ag_x$)($In_{1-y}Ga_y$)$Se_2$ (x varies from 0 to 1, y varies from 0 to 1)), ($Cu_{1-x}Au_x$)$InS_2$ (x varies from 0 to 1), ($Cu_{1-x}Au_x$)$CuGaS_2$ (x varies from 0 to 1), ($Cu_{1-x}Au_x$)($In_{1-y}Ga_y$)$S_2$ (x varies from 0 to 1, y varies from 0 to 1), ($Cu_{1-x}Au_x$)$InSe_2$ (x varies from 0 to 1), ($Cu_{1-x}Au_x$)$GaSe_2$ (x varies from 0 to 1), ($Cu_{1-x}Au_x$)($In_{1-x}Ga_x$)$Se_2$ (x varies from 0 to 1), ($Ag_{1-x}Au_x$)($In_{1-x}Ga_x$)$Se_2$ (x varies from 0 to 1), ($Cu_{1-x-y}Ag_xAu_y$)($In_{1-z}Ga_z$)$Se_2$ (x varies from 0 to 1, y varies from 0 to 1, z varies from 0 to 1), ($Cu_{1-x}Au_x$)$_2$S (x varies from 0 to 1), ($Ag_{1-x}Au_x$)$_2$S (x varies from 0 to 1), ($Cu_{1-x-y}Ag_xAu_y$)$_2$S (x varies from 0 to 1, y varies from 0 to 1), indium sulfide ($In_2S_3$), indium selenide ($In_2Se_3$), aluminum nitride (AlN), indium nitride (InN), gallium nitride (GaN), bismuth sulfide ($Bi_2S_3$), antimony sulfide ($Sb_2S_3$), silver sulfide ($Ag_2S$), tungsten sulfide ($WS_2$), tungsten selenide ($WSe_2$), molybdenum sulfide ($MoS_2$), molybdenum selenide ($MoSe_2$), tin sulfide ($SnS_x$ (x varies from 1 to 2)), tin selenide ($SnSe_x$ (x varies from 1 to 2)), copper tin sulfide ($Cu_4SnS_4$).

The semiconductor layers may also contain up to 80 vol. % of an oxide material selected from the group consisting of magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

An n-type semiconductor layer may include at least one n-type semiconductor material selected from the group consisting of silicon (Si), germanium (Ge), tin (Sn), beta iron silicide (β-FeSi$_2$), indium antimony (InSb), indium arsenic (InAs), indium phosphate (InP), gallium phosphate (GaP), aluminum phosphate (AlP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide ($Cu_{1-x}S$ (x varies from 1 to 2)), copper selenide ($Cu_{1-x}Se$ (x varies from 1 to 2)), copper indium disulfide ($CuInS_2$), copper gallium disulfide ($CuGaS_2$), copper indium gallium disulfide, ($Cu(In_{1-x}Ga_x)S_2$ (x varies from 0 to 1)), copper indium diselenide ($CuInSe_2$), copper gallium diselenide ($CuGaSe_2$), copper indium gallium diselenide ($Cu(In_{1-x}Ga_x)Se_2$ (x varies from 0 to 1)), copper silver indium gallium disulfide-($Cu_{1-x}Ag_x$)($In_{1-y}Ga_y$)$S_2$ (x varies from 0 to 1, y varies from 0 to 1)), copper silver indium gallium diselenide ($Cu_{1-x}Ag_x$)($In_{1-y}Ga_y$)$Se_2$ (x varies from 0 to 1, y varies from 0 to 1)), ($Cu_{1-x}Au_x$)$InS_2$ (x varies from 0 to 1), ($Cu_{1-x}Au_x$)$CuGaS_2$ (x varies from 0 to 1), ($Cu_{1-x}Au_x$)($In_{1-y}Ga_y$)$S_2$ (x varies from 0 to 1, y varies from 0 to 1), ($Cu_{1-x}Au_x$)$InSe_2$ (x varies from 0 to 1), ($Cu_{1-x}Au_x$)$GaSe_2$ (x varies from 0 to 1), ($Cu_{1-x}Au_x$)($In_{1-x}Ga_x$)$Se_2$ (x varies from 0 to 1), ($Ag_{1-x}Au_x$)($In_{1-x}Ga_x$)$Se_2$ (x varies from 0 to 1), ($Cu_{1-x-y}Ag_xAu_y$)($In_{1-z}Ga_z$)$Se_2$ (x varies from 0 to 1, y varies from 0 to 1, z varies from 0 to 1), $(Cu_{1-x}Au_x)_2S$ (x varies from 0 to 1), $(Ag_{1-x}Au_x)_2S$ (x varies from 0 to 1), $(Cu_{1-x-y}Ag_xAu_y)_2S$ (x varies from 0 to 1, y varies from 0 to 1), indium sulfide ($In_2S_3$), indium selenide ($In_2Se_3$), aluminum nitride (AlN), indium nitride (InN), gallium nitride (GaN), bismuth sulfide ($Bi_2S_3$), antimony sulfide ($Sb_2S_3$), silver sulfide ($Ag_2S$), tungsten sulfide ($WS_2$), tungsten selenide ($WSe_2$), molybdenum sulfide ($MoS_2$), molybdenum selenide ($MoSe_2$), tin sulfide ($SnS_x$ (x varies from 1 to 2)), tin selenide ($SnSe_x$ (x varies from 1 to 2)), copper tin sulfide ($Cu_4SnS_4$). Such semiconductors may be doped by adding an impurity of valence-five elements such as nitrogen (N), phosphorus (P), arsenic (As), or antimony (Sb)), in order to increase the number of free (in this case negative (electron)) charge carriers.

One or more of the n-type semiconductor layers may also contain up to 80 vol. % of oxide material selected from the group consisting magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

The p-type semiconductor layers may comprise at least one p-type semiconductor material selected from the group consisting of silicon (Si), germanium (Ge), tin (Sn), beta iron silicide ($\beta$-$FeSi_2$), indium antimony (InSb), indium arsenic (InAs), indium phosphate (InP), gallium phosphate (GaP), aluminum phosphate (AlP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide ($Cu_{1-x}S$ (x varies from 1 to 2)), copper selenide ($Cu_{1-x}Se$ (x varies from 1 to 2)), copper indium disulfide ($CuInS_2$), copper gallium disulfide ($CuGaS_2$), copper indium gallium disulfide, ($Cu(In_{1-x}Ga_x)S_2$ (x varies from 0 to 1)), copper indium diselenide ($CuInSe_2$), copper gallium diselenide ($CuGaSe_2$), copper indium gallium diselenide ($Cu(In_{1-x}Ga_x)Se_2$ (x varies from 0 to 1)), copper silver indium gallium disulfide ($Cu_{1-x}Ag_x)(In_{1-y}Ga_y)S_2$ (x varies from 0 to 1, y varies from 0 to 1)), copper silver indium gallium diselenide ($Cu_{1-x}Ag_x)(In_{1-y}Ga_y)Se_2$ (x varies from 0 to 1, y varies from 0 to 1)), $(Cu_{1-x}Au_x)InS_2$ (x varies from 0 to 1), $(Cu_{1-x}Au_x)CuGaS_2$ (x varies from 0 to 1), $(Cu_{1-x}Au_x)(In_{1-y}Ga_y)S_2$ (x varies from 0 to 1, y varies from 0 to 1), $(Cu_{1-x}Au_x)InSe_2$ (x varies from 0 to 1), $(Cu_{1-x}Au_x)GaSe_2$ (x varies from 0 to 1), $(Cu_{1-x}Au_x)(In_{1-x}Ga_x)Se_2$ (x varies from 0 to 1), $(Ag_{1-x}Au_x)(In_{1-x}Ga_x)Se_2$ (x varies from 0 to 1), $(Cu_{1-x-y}Ag_xAu_y)(In_{1-z}Ga_z)Se_2$ (x varies from 0 to 1, y varies from 0 to 1, z varies from 0 to 1), $(Cu_{1-x}Au_x)_2S$ (x varies from 0 to 1), $(Ag_{1-x}Au_x)_2S$ (x varies from 0 to 1), $(Cu_{1-x-y}Ag_xAu_y)_2S$ (x varies from 0 to 1, y varies from 0 to 1), indium sulfide ($In_2S_3$), indium selenide ($In_2Se_3$), aluminum nitride (AlN), indium nitride (InN), gallium nitride (GaN), bismuth sulfide ($Bi_2S_3$), antimony sulfide ($Sb_2S_3$), silver sulfide ($Ag_2S$), tungsten sulfide ($WS_2$), tungsten selenide ($WSe_2$), molybdenum sulfide ($MoS_2$), molybdenum selenide ($MoSe_2$), tin sulfide ($SnS_x$ (x varies from 1 to 2)), tin selenide ($SnSe_x$ (x varies from 1 to 2)), copper tin sulfide ($Cu_4SnS_4$). Such semiconductors may be doped by adding an impurity of valence-three elements such as boron (B), gallium (Ga), indium (In), or aluminum (Al), in order to increase the number of free (in this case positive (hole)) charge carriers.

One or more of the p-type semiconductor layers may also contain up to 80 vol. % of oxide material selected from the group consisting magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

U.S. application Ser. Nos. 12/016,172, 11/923,036, and 11/923,070 all of which are incorporated by reference herein in their entirety for all purposes, disclose photovoltaic structures having a photoactive conversion layer comprising one or more granular semiconductor and oxide layers with nanometer-size semiconductor grains surrounded by a matrix of oxide.

The top conductive layers may consist of at least one conductive layer. This layer may also be transparent to the solar radiation. This will allow photons to reach semiconductor layers for conversion into electrical energy. The conductive layer may comprise an oxide material selected from the group consisting magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide. For example the top conductive layers structure may consist of ZnO layer that is formed over the semiconductor layer and a combination of zinc and aluminum oxide (ZnO+ $Al_2O_3$) layer that is formed over the ZnO layer. In another example a $TiO_2$ layer is formed over the semiconductor layer and indium thin oxide (ITO) is formed over the $TiO_2$ layer.

FIGS. 16a and 16b illustrate example structures and configurations of solar cells, according to possible implementations of the invention, that incorporate the layer structures discussed above. As FIG. 16a illustrates, Solar cell 101a may comprise (in overlying sequence) transparent substrate 8000 or non-transparent substrate 8600, contact layer 9000, photoactive conversion layer 80, transparent conductive layer 7000, and transparent material layer 8000. In some implementations, the transparent layer 8000 may be glass, plastic or other suitable protective material. In some implementations, the transparent layer 8000 may be glass, plastic or other suitable protective material. Contact layer 9000 may comprise set of Seed layers and Underlayers as described above. As FIG. 16b illustrates, photoactive conversion layer 80 may include a plurality of sub-layers including one or more of a seed layer 6000, one or more interlayers 5000 (in this implementation, the seed layer 6000 and underlayers 5000 may replace the contact layer 9000), one or more n-type semiconductor and oxide layers 2101, and a hole conducting material layer 3000. As the foregoing description demonstrates, the structure and configuration of the conversion layer 80 may vary considerably.

Transparent layer 8000 can be a glass substrate or deposited layer made of a variety of materials, such as silicon dioxide. Alternatively, a transparent polymer can be used. Still further, one or more of the transparent conducting layers 7000 can be replaced by conductive oxide layer and metal contacts arranged in a grid (e.g., fingers and busbars). Additional layers, such as anti-reflection coatings can also be added. The layer stack can be deposited on glass, polymer or metal substrates. If the layer stack is deposited on top of a non-transparent substrate, the top contact is transparent to allow light penetration into the photoactive conversion layer. Transparent substrate layer 8000 can be replaced by other suitable protective layers or coatings, or be added during construction of a solar module or panel. Still further, the layers described herein may be deposited on a flat substrate (such as a glass substrate intended for window installations), or directly on one or more surfaces of a non-imaging solar concentrator, such as a trough-like or Winston optical concentrator.

The following sets forth an example manufacturing process for fabrication of solar cells that combines physical and chemical vapor depositions. First, a physical vapor deposition (PVD) is used to deposit one of the following layer structures:
1) Underlayer1/semiconductor layers (FIG. 6);
2) Underlayer1/Underlayer2/semiconductor layers (FIG. 7);
3) Underlayer1/Underlayer2/Underlayer3/semiconductor layers (FIG. 8);
4) Underlayer1/Underlayer2/Underlayer3/Underlayer4/ semiconductor layers (FIG. 9);
5) Seed layer/Underlayer1/semiconductor layers (FIG. 10);
6) Seed layer/Underlayer1/Underlayer2/semiconductor layers (FIG. 11);
7) Seed layer/Underlayer1/Underlayer2/Underlayer3/ semiconductor layers (FIG. 12); or
8) Seed layer/Underlayer1/Underlayer2/Underlayer3/Underlayer4/semiconductor layers (FIG. 13).

The foregoing layer structures, in one implementation, are deposited on top of non-single crystal substrates. As discussed above, seed layer and underlayers are used to achieve epitaxial growth of the semiconductor layers using PVD. Then, a chemical vapor deposition (CVD) is used to deposit additional semiconductor layers on top of PVD-deposited epitaxial semiconductor layers. Semiconductors deposited using CVD have low defect concentration. This is one of the main reasons for growing Si-based solar cells using CVD. Furthermore, high deposition rates can be reached using CVD. The semiconductor layers are covered with a top contact that can be deposited by either PVD or CVD. The top contact should be conductive and, in most of cases, transparent. In these solar cell structures, semiconductor layers are used to convert light into charge carriers. To achieve charge separation and produce photovoltaic effect, semiconductor layers are comprised of at least one p-type and at least one n-type semiconductor. The main advantage of this process is growth of epitaxial semiconductor layers on top of non-single crystal substrates, such as metal, plastic or glass substrate.

To increase the efficiency of solar cells, it may be desirable to form an Ohmic contact between the metallic underlayer and the overlaying semiconductor layer. If the overlaying semiconductor layer is a p-type semiconductor, the work function of metal underlayer should be larger than the work function of the overlaying semiconductor to achieve Ohmic contact. On the other hand, if the overlaying semiconductor layer is n-type semiconductor, the work function of the metal underlayer should be lower than the work function of the overlaying semiconductor to achieve Ohmic contact.

The work function of some p-type semiconductors is larger than that of metal materials. In this case, an Ohmic contact can be achieved by depositing a thin highly doped p-type semiconductor before depositing the p-type semiconductor layer with the large work function. This creates a thin highly doped region that carriers can tunnel through. Another way to achieve an Ohmic contact is to deposit a very low band semiconductor material, such as Sb2Te3, or an oxide before depositing the p-type semiconductor layer with the large work function.

In the previous description, numerous specific details are set forth, such as specific materials, structures, processes, etc., in order to provide a better understanding of the present invention. However, the present invention can be practiced without resorting to the details specifically set forth. In other instances, well-known processing materials and techniques have not been described in detail in order not to unnecessarily obscure the present invention. Only the preferred embodiments of the present invention and but a few examples of its versatility are shown and described in the present disclosure. It is to be understood that the present invention is capable of use in various other combinations and is susceptible of changes and/or modifications within the scope of the inventive concept as expressed herein.

What is claimed is:

1. A photovoltaic cell, comprising
a non-textured substrate;
a non-magnetic amorphous or nanocrystalline seed layer disposed over the substrate, the
seed layer being a metallic material;
an underlayer comprising one or more metallic sub-layers deposited over the seed layer,
wherein the underlayer layer promotes growth in a first growth direction of a majority of grains of one or more overlying semiconductor layers;
a first semiconductor layer comprising an electron conducting material;
a second semiconductor layer comprising a hole conducting material; and
a transparent conductive layer.

2. The photovoltaic cell of claim 1 wherein the first semiconductor layer comprises two or more semiconductor sub-layers each comprising a hole conducting material.

3. The photovoltaic cell of claim 1 wherein the second semiconductor layer comprises two or more semiconductor sub-layers each comprising an electron conducting material.

4. The photovoltaic cell of claim 1 wherein the first semiconductor layer comprises two or more semiconductor sub-layers each comprising a hole conducting material and the second semiconductor layer comprises two or more semiconductor sub-layers each comprising an electron conducting material.

5. A photovoltaic cell, comprising
a non-textured substrate;
a non-magnetic amorphous or nanocrystalline seed layer disposed over the substrate, the seed layer being a metallic material;
an fcc underlayer with <111>growth directions formed over the seed layer;
a bcc underlayer with <110>growth directions formed over the fcc underlayer, wherein the bcc underlayer promotes growth in a first growth direction of a majority of grains of one or more overlying semiconductor layers;
a first semiconductor layer comprising an electron conducting material;

a second semiconductor layer comprising a hole conducting material; and
a transparent conductive layer.

6. The photovoltaic cell of claim 5 wherein the first semiconductor layer is formed over the second semiconductor layer, and wherein the second semiconductor layer is formed over the bcc underlayer.

7. The photovoltaic cell of claim 5 wherein the second semiconductor layer is formed over the first semiconductor layer.

8. The photovoltaic cell of claim 5 wherein at least one of the first and second semiconductor layers comprises one or more semiconductor and oxide layers comprising an oxide and a semiconductor, wherein the oxide is dispersed at grain boundaries of the semiconductor.

9. The photovoltaic cell of claim 1 wherein the first semiconductor layer or the second semiconductor layer is deposited onto the underlayer layer.

10. The photovoltaic cell of claim 1 wherein the underlayer comprises at least one metallic material having hcp or fcc or bcc lattice structure with a <0001> or <111> or <110> growth directions.

11. The photovoltaic cell of claim 1 wherein the underlayer comprises at least two metallic materials, wherein a first metallic material of the underlayer has an hcp lattice structure with <0001> growth directions and a second metallic material of the underlayer has an fcc lattice structure with <111> growth directions.

12. The photovoltaic cell of claim 1 wherein the underlayer comprises at least two metallic materials, wherein a first metallic material of the underlayer has an fcc lattice structure with <111> growth directions and a second metallic material of the underlayer has a bcc lattice structure with <110> growth directions.

13. The photovoltaic cell of claim 1 wherein the underlayer comprises at least two metallic materials, wherein a first metallic material of the underlayer has an hcp lattice structure with <0001> growth directions and a second metallic material of the underlayer has a bcc lattice structure with <110> growth directions.

14. The photovoltaic cell of claim 1 wherein the underlayer comprises at least three metallic materials, wherein a first metallic material of the underlayer has a fcc lattice structure with <111> growth directions, a second metallic material of the underlayer has a hcp lattice structure with <0001> growth directions, and a third metallic material of the underlayer has a bcc lattice structure with <110> growth directions.

15. The photovoltaic cell of claim 1 wherein the seed layer comprises $Si_3N_4$.

16. The photovoltaic cell of claim 1 wherein the seed layer comprises at least one metallic nanocrystalline or amorphous layer.

17. The photovoltaic cell of claim 16 wherein at least one seed layer comprises:
at least one element from the group consisting of V, Cr, Mn, Fe, Co, and Ni; and
at least one element from the group consisting of B, C, Al, Si, P, Sc, Ti, Cu, Zn, Ga, Ge, Sr, Y, Zr, Nb, Mo, Ru, Rh, Pd, Ag, In, Sn, Te, Hf, Ta, W, Re, Ir, Pt, and Au.

18. The photovoltaic cell of claim 16 wherein at least one seed layer comprises:
10 to 96 at. % of least one element from the group consisting of V, Cr, Mn, Fe, Co, and Ni; and
4 to 50 at. % of least one element from the group consisting of B, C, P, Si, Ti, Ge, Zr, Mo, Hf, Ta, and W.

19. The photovoltaic cell of claim 16 wherein at least one seed layer comprises:

10 to 90 at. % of least one element from the group consisting of V, Cr, Mn, Fe, Co, and Ni;
4 to 50 at. % of least one element from the group consisting of B, C, P, Si, Ge, Zr, Mo, Hf, Ta, and W; and
at least one element from the group consisting of Al, Sc, Ti, Cu, Zn, Ga, Sr, Y, Ru, Rh, Pd, Ag, In, Te, Sn, Re, Ir, Pt, and Au.

20. The photovoltaic cell of claim 16 wherein at least one seed layer comprises at least one element selected from the group consisting of B, P, Sc, Ti, V, Cr, Mn, Fe, Co, Ni, Cu, Y, Zr, Nb, Mo, Ru, Rh, Pd, Ag, In, Te, Hf, Ta, W, Re, Ir, Pt, and Au.

21. The photovoltaic cell of claim 1 wherein the underlayer comprises at least one metallic material having a hcp or fcc or bcc lattice structure.

22. The photovoltaic cell of claim 21 wherein the metallic material of the underlayer has the hcp lattice structure and wherein the underlayer comprises at least one element from the group consisting of Sc, Ti, Co, Zn, Y, Zr, Ru, Hf, and Re.

23. The photovoltaic cell of claim 21 wherein the metallic material of the underlayer has the hcp lattice structure and wherein the underlayer comprises:
at least one element from the group consisting of Sc, Ti, Co, Zn, Y, Zr, Ru, Hf, and Re; and
at least one element from the group consisting of B, C, N, 0, Na, Si, S, P, K, Al, V, Cr, Mn, Fe, Ni, Cu, Ga, Ge, Se, Nb, Mo, Rh, Pd, Ag, Cd, In, Sn, Sb, Te, Ta, W, Ir, Pt, Au, and Bi.

24. The photovoltaic cell of claim 21 wherein the metallic material of the underlayer has the fcc lattice structure and wherein the underlayer comprises at least one element from the group consisting of Al, Ni, Cu, Rh, Pd, Ag, Ir, Pt, Au, and Pb.

25. The photovoltaic cell of claim 21 wherein the metallic material of the underlayer has the fcc lattice structure and wherein the underlayer comprises:
at least one element from the group consisting of Al, Ni, Cu, Rh, Pd, Ag, Ir, Pt, Au, and Pb; and
at least one element from the group consisting of B, C, N, 0, Na, Si, S, P, K, Sc, Ti, V, Cr, Mn, Fe, Co, Zn, Ga, Ge, Se, Y, Zr, Nb, Mo, Ru, Cd, In, Sn, Sb, Te, Hf, Ta, W, Re, and Bi.

26. The photovoltaic cell of claim 21 wherein the metallic material of the underlayer has the bcc lattice structure and wherein the underlayer comprises at least one element from the group consisting of V, Cr, Fe, Nb, Mo, Ta, W.

27. The photovoltaic cell of claim 21 wherein the metallic material of the underlayer has the bcc lattice structure and wherein the underlayer comprises:
at least one element from the group consisting of V, Cr, Fe, Nb, Mo, Ta, and W; and
at least one element from the group consisting of B, C, N, 0, Na, Si, S, P, K, Sc, Ti, Mn, Co, Ni, Cu, Zn, Ga, Ge, Se, Y, Zr, Ru, Rh, Pd, Ag, Cd, In, Sn, Sb, Te, Hf, Re, Ir, Pt, Au, and Bi.

28. The photovoltaic cell of claim 1 wherein the underlayer comprises at least one metallic material having an hcp lattice structure with <0001> growth directions or an fcc lattice structure with <111> growth directions, or a bcc lattice structure with <110> growth directions.

29. The photovoltaic cell of claim 1 wherein the underlayer comprises at least two metallic materials, wherein a first metallic material of the underlayer has a hcp lattice structure with <0001> growth directions and a second metallic material of the underlayer has a fcc lattice structure with <111> growth directions.

30. The photovoltaic cell of claim 1 wherein the underlayer comprises at least two metallic materials, wherein a first metallic material of the underlayer has a fcc lattice structure with <111>growth directions and a second metallic material of the at least two metallic materials has a bcc lattice structure with <110>growth directions.

31. The photovoltaic cell of claim 1 wherein the underlayer comprises at least two metallic materials, wherein a first metallic material of the underlayer has a hcp lattice structure with <0001>growth directions and a second metallic material of the at least two metallic materials has a bcc lattice structure with <110>growth directions.

32. The photovoltaic cell of claim 1, wherein the underlayer promotes substantially epitaxial growth of one or more overlying semiconductor layers.

33. The photovoltaic cell of claim 1, wherein the underlayer promotes textured growth of one or more overlying semiconductor layers.

34. The photovoltaic cell of claim 1, wherein the seed layer promotes growth in a second growth direction of a majority of grains of the overlying underlayer.

\* \* \* \* \*